(12) United States Patent
Kim et al.

(10) Patent No.: US 11,531,434 B2
(45) Date of Patent: Dec. 20, 2022

(54) DISPLAY DEVICE INCLUDING INORGANIC INSULTING LAYER IN BENDING AREA

(71) Applicant: SAMSUNG DISPLAY CO., LTD., Yongin-si (KR)

(72) Inventors: Kyongjun Kim, Yongin-si (KR); Sungsik Yun, Yongin-si (KR); Juyeon Seo, Yongin-si (KR); Jinsuk Park, Yongin-si (KR); Jaebok Lee, Yongin-si (KR); Sungho Cho, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 16/880,330

(22) Filed: May 21, 2020

(65) Prior Publication Data

US 2021/0165527 A1 Jun. 3, 2021

(30) Foreign Application Priority Data

Nov. 28, 2019 (KR) .......................... 10-2019-0156186

(51) Int. Cl.
*G06F 3/044* (2006.01)
*H01L 51/00* (2006.01)
(Continued)

(52) U.S. Cl.
CPC .......... *G06F 3/0445* (2019.05); *H01L 27/323* (2013.01); *H01L 51/0097* (2013.01); *H01L 51/5253* (2013.01); *H01L 51/56* (2013.01); *G06F 2203/04102* (2013.01); *G06F 2203/04103* (2013.01); *H01L 27/3244* (2013.01); *H01L 2227/323* (2013.01); *H01L 2251/5338* (2013.01)

(58) Field of Classification Search
CPC . H01L 51/5253; H01L 51/0097; H01L 51/56; H01L 27/323; H01L 2227/323; H01L 27/3244; H01L 2251/5338; H01L 27/3258; H01L 2251/558; H01L 51/5256; H01L 51/5281; G06F 3/0445; G06F 2203/04103; G06F 2203/04102; G06F 3/0412; Y02E 10/549
See application file for complete search history.

(56) References Cited

U.S. PATENT DOCUMENTS 9,740,035 B2   8/2017 Kwon et al.
10,134,827 B2  11/2018 Choi et al.
(Continued)

FOREIGN PATENT DOCUMENTS

CN   109903679 A   6/2019
KR   1020110058356 A   6/2011
(Continued)

*Primary Examiner* — Yaron Cohen
(74) *Attorney, Agent, or Firm* — Cantor Colburn LLP

(57) ABSTRACT

A display device includes (i) a substrate having a first area, a second area, and a bending area located between the first area and the second area, where the substrate is bent along a bending axis in the bending area, the substrate includes a thin portion at an edge portion of the bending area, and the thin portion extends from the second area to the first area and has a thickness less than a thickness of the substrate at a center of the bending area; and (ii) an inorganic insulating layer over the substrate, where the inorganic insulating layer exposes the thin portion in the bending area.

52 Claims, 22 Drawing Sheets

(51) Int. Cl.
  *H01L 27/32* (2006.01)
  *H01L 51/52* (2006.01)
  *H01L 51/56* (2006.01)

(56) References Cited

U.S. PATENT DOCUMENTS

2018/0053816 A1* 2/2018 Choi .................. H01L 51/5253
2019/0012031 A1  1/2019 Kim et al.
2019/0081273 A1  3/2019 Sung et al.
2019/0138122 A1* 5/2019 Ryu ........................ B32B 38/10

FOREIGN PATENT DOCUMENTS

| KR | 1020140103025 A | 8/2014 |
| KR | 1020180021293 A | 3/2018 |
| KR | 1020190029830 A | 3/2019 |

* cited by examiner

DISPLAY DEVICE INCLUDING INORGANIC INSULATING LAYER IN BENDING AREA

This application claims priority to Korean Patent Application No. 10-2019-0156186, filed on Nov. 28, 2019, and all the benefits accruing therefrom under 35 U.S.C. § 119, the content of which in its entirety is herein incorporated by reference.

BACKGROUND

1. Field

One or more exemplary embodiments relate to a display device, and more particularly, to a display device capable of minimizing defects in a manufacturing process or a using process after the manufacturing process.

2. Description of Related Art

In general, a display device includes a display unit located on a substrate. Visibility at various angles may be improved or the size of a non-display area may be reduced by bending at least a part of the display device.

SUMMARY

However, in a process of manufacturing a conventional display device that is bent or a using process after the manufacturing process, defects may occur in a bending portion or a portion near the bending portion.

One or more exemplary embodiments include a display device capable of minimizing defects in a manufacturing process or a using process after the manufacturing process. However, the technical problems are merely examples, and the scope of the present disclosure is not limited to the technical problems.

Additional aspects will be set forth in part in the description which follows and, in part, will be apparent from the description, or may be learned by practice of the presented exemplary embodiments of the disclosure.

According to one or more exemplary embodiments, a display device includes a substrate having a first area, a second area, and a bending area disposed between the first area and the second area, where the substrate is bent along a bending axis in the bending area, the substrate includes a thin portion at an edge portion of the bending area, and the thin portion extends from the second area to the first area and has a thickness less than a thickness of the substrate at a center of the bending area; and an inorganic insulating layer over the substrate, where the inorganic insulating layer exposes the thin portion in the bending area.

In an exemplary embodiment, the thin portion may define a first groove extending from the second area to the first area, and the inorganic insulating layer may have a first opening corresponding to the first groove.

In an exemplary embodiment, a width of the first groove may be greater than a width of the first opening in a direction of the bending axis.

In an exemplary embodiment, an inner side surface of the first opening may protrude from an edge of the first groove in a direction to a center of the first opening.

In an exemplary embodiment, the substrate may have a second groove between an edge of the substrate and the first groove in the bending area, the second groove may extend from the second area to the first area, and the inorganic insulating layer may have a second opening corresponding to the second groove in the bending area.

In an exemplary embodiment, a width of the second groove may be greater than a width of the second opening in a direction of the bending axis.

In an exemplary embodiment, an inner side surface of the second opening may protrude from an edge of the second groove in a direction to a center of the second opening.

In an exemplary embodiment, the second groove may extend nonparallel to the first groove.

In an exemplary embodiment, the first groove may extend to have a linear shape, and the second groove may extend to have a curved shape.

In an exemplary embodiment, the display device may further include a metal layer which covers an inner side surface of the first opening and a bottom surface of the first groove.

In an exemplary embodiment, a portion of the metal layer on the inner side surface of the first opening and a portion of the metal layer on the bottom surface of the first groove may be connected to each other.

In an exemplary embodiment, the display device may further include an additional insulating layer over the inorganic insulating layer and having an additional opening corresponding to the first opening in the bending area.

In an exemplary embodiment, a width of the additional opening may be greater than a width of the first opening in a direction of the bending axis.

In an exemplary embodiment, an inner side surface of the first opening may protrude from an edge of the additional opening in a direction to a center of the first opening.

In an exemplary embodiment, the thin portion may extend up to an end of the substrate along a direction of the bending axis.

In an exemplary embodiment, an edge of the inorganic insulating layer close to the thin portion may correspond to an edge of the thin portion in a direction to the center of the bending area.

In an exemplary embodiment, a part of an edge of the thin portion in a direction to the center of the bending area may have a linear shape extending from the second area to the first area, and a part of an edge of the inorganic insulating layer in a direction to the thin portion may have a linear shape extending from the second area to the first area.

In an exemplary embodiment, the end of the substrate in a direction of the bending axis may have a curved shape.

In an exemplary embodiment, an end of the inorganic insulating layer close to the thin portion may protrude in a direction to a center of the thin portion, such that a bottom surface of an end portion of the inorganic insulating layer in the direction to the center of the thin portion may be spaced apart from the substrate.

In an exemplary embodiment, the display device may further include a metal layer which covers a side surface of an end of the inorganic insulating layer close to the thin portion and a top surface of the thin portion.

In an exemplary embodiment, a portion of the metal layer on the side surface of the inorganic insulating layer and a portion of the metal layer on the top surface of the thin portion may be connected to each other.

In an exemplary embodiment, the display device may further include an additional insulating layer over the inorganic insulating layer and exposing a top surface of an end portion of the inorganic insulating layer close to the thin portion.

In an exemplary embodiment, the metal layer may cover a part of a top surface of the inorganic insulating layer.

In an exemplary embodiment, the display device may further include a touch sensor layer over the first area of the substrate, where the touch sensor layer may include a first touch conductive layer, and the metal layer may include the same material as a material of the first touch conductive layer.

In an exemplary embodiment, the display device may further include a protective layer over the first area and the bending area, where the protective layer may be interposed between the inorganic insulating layer and the touch sensor layer and contact the touch sensor layer, and the metal layer may be on the protective layer to contact the protective layer.

In an exemplary embodiment, the metal layer may have a multi-layer structure.

In an exemplary embodiment, the display device may further include a touch sensor layer over the first area of the substrate, where the touch sensor layer may include a first touch conductive layer and a second touch conductive layer, the metal layer may include a first metal layer including the same material as a material of the first touch conductive layer and a second metal layer including the same material as a material of the second touch conductive layer and located on the first metal layer.

In an exemplary embodiment, the display device may further include a protective layer over the first area and the bending area, where the protective layer may be interposed between the inorganic insulating layer and the touch sensor layer and contact the touch sensor layer, and the first metal layer is on the protective layer to contact the protective layer.

In an exemplary embodiment, a thickness of a portion of the inorganic insulating layer corresponding to the bending area may be less than a thickness of a portion of the inorganic insulating layer corresponding to a center of the first area.

According to one or more exemplary embodiments, a display device includes a substrate having a first area, a second area, and a bending area disposed between the first area and the second area, where the substrate is bent along a bending axis in the bending area, the substrate has a first groove at an edge portion of the bending area, and the first groove extends from the second area to the first area; and an inorganic insulating layer over the substrate, where the inorganic insulating layer exposes the first groove in the bending area.

In an exemplary embodiment, the inorganic insulating layer may have a first opening corresponding to the first groove.

In an exemplary embodiment, a width of the first groove may be greater than a width of the first opening in a direction of the bending axis.

In an exemplary embodiment, an inner side surface of the first opening may protrude from an edge of the first groove in a direction to a center of the first opening.

In an exemplary embodiment, the substrate may have a second groove between an edge of the substrate and the first groove in the bending area, the second groove may extend from the second area to the first area, and the inorganic insulating layer may have a second opening corresponding to the second groove in the bending area.

In an exemplary embodiment, a width of the second groove may be greater than a width of the second opening in a direction of the bending axis.

In an exemplary embodiment, an inner side surface of the second opening may protrude from an edge of the second groove in a direction to a center of the second opening.

In an exemplary embodiment, the second groove may extend nonparallel to the first groove.

In an exemplary embodiment, the first groove may extend to have a linear shape, and the second groove may extend to have a curved shape.

In an exemplary embodiment, the display device may further include a metal layer which covers an inner side surface of the first opening and a bottom surface of the first groove.

In an exemplary embodiment, a portion of the metal layer on the inner side surface of the first opening and a portion of the metal layer on the bottom surface of the first groove may be connected to each other.

In an exemplary embodiment, the display device may further include an additional insulating layer over the inorganic insulating layer, where the additional insulating layer may have an additional opening corresponding to the first opening in the bending area.

In an exemplary embodiment, a width of the additional opening may be greater than a width of the first opening in a direction of the bending axis.

In an exemplary embodiment, an inner side surface of the first opening may protrude from an edge of the additional opening in a direction to a center of the first opening.

In an exemplary embodiment, the metal layer may cover a part of a top surface of the inorganic insulating layer.

In an exemplary embodiment, the display device may further include a touch sensor layer over the first area of the substrate and including a first touch conductive layer, where the metal layer may include the same material as a material of the first touch conductive layer.

In an exemplary embodiment, the display device may further include a protective layer over the first area and the bending area, where the protective layer may be interposed between the inorganic insulating layer and the touch sensor layer and contact the touch sensor layer, and the metal layer may be on the protective layer to contact the protective layer.

In an exemplary embodiment, the metal layer may have a multi-layer structure.

In an exemplary embodiment, the display device may further include a touch sensor layer over the first area of the substrate, where the touch sensor layer may include a first touch conductive layer and a second touch conductive layer, where the metal layer may include a first metal layer including the same material as a material of the first touch conductive layer and a second metal layer including the same material as a material of the second touch conductive layer, and the second metal layer may be on the first metal layer.

In an exemplary embodiment, the display device may further include a protective layer over the first area and the bending area, where the protective layer may be interposed between the inorganic insulating layer and the touch sensor layer and contact the touch sensor layer, and the first metal layer may be on the protective layer to contact the protective layer.

In an exemplary embodiment, a thickness of a portion of the inorganic insulating layer corresponding to the bending area may be less than a thickness of a portion of the inorganic insulating layer corresponding to a center of the first area.

Other features and advantages of the present disclosure will become more apparent from the drawings, the claims, and the detailed description.

BRIEF DESCRIPTION OF THE DRAWINGS

The above and other aspects, features, and advantages of certain exemplary embodiments of the disclosure will be more apparent from the following description taken in conjunction with the accompanying drawings, in which.

DETAILED DESCRIPTION

Figure 1:
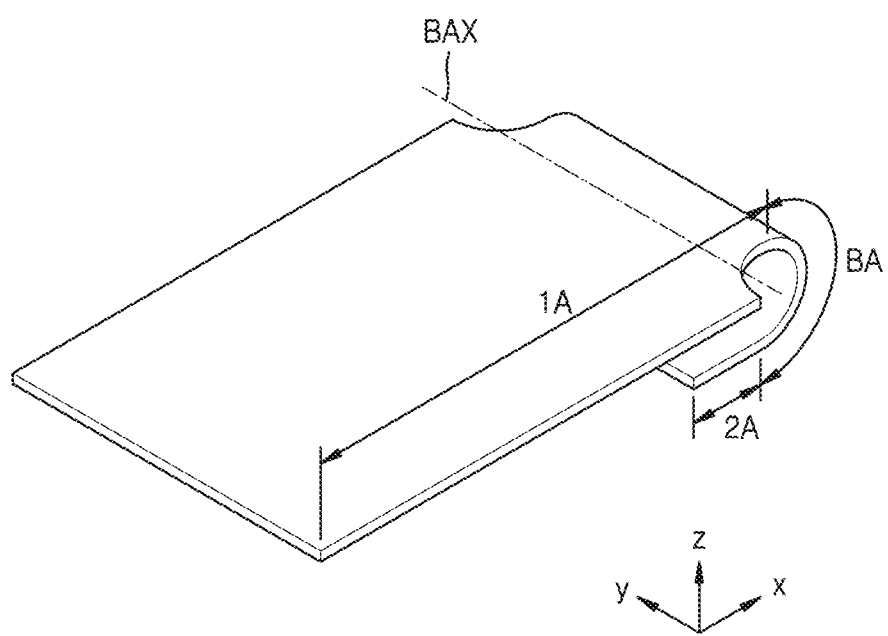
FIG. 1 is a perspective view illustrating a part of a display device according to an exemplary embodiment of the present disclosure.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Hereinafter, exemplary embodiments of the present disclosure will be described with reference to the accompanying drawings, and like reference numerals in the drawings denote like elements and thus their description will not be repeated.

It will be understood that when a component, such as a layer, a film, a region, or a plate, is referred to as being "on" another component, the component may be directly on the other component or intervening components may be present thereon. Sizes of components in the drawings may be exaggerated for convenience of explanation. In other words, since sizes and thicknesses of components in the drawings are arbitrarily illustrated for convenience of explanation, the following exemplary embodiments are not limited thereto. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

In the following exemplary embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Figure 2:
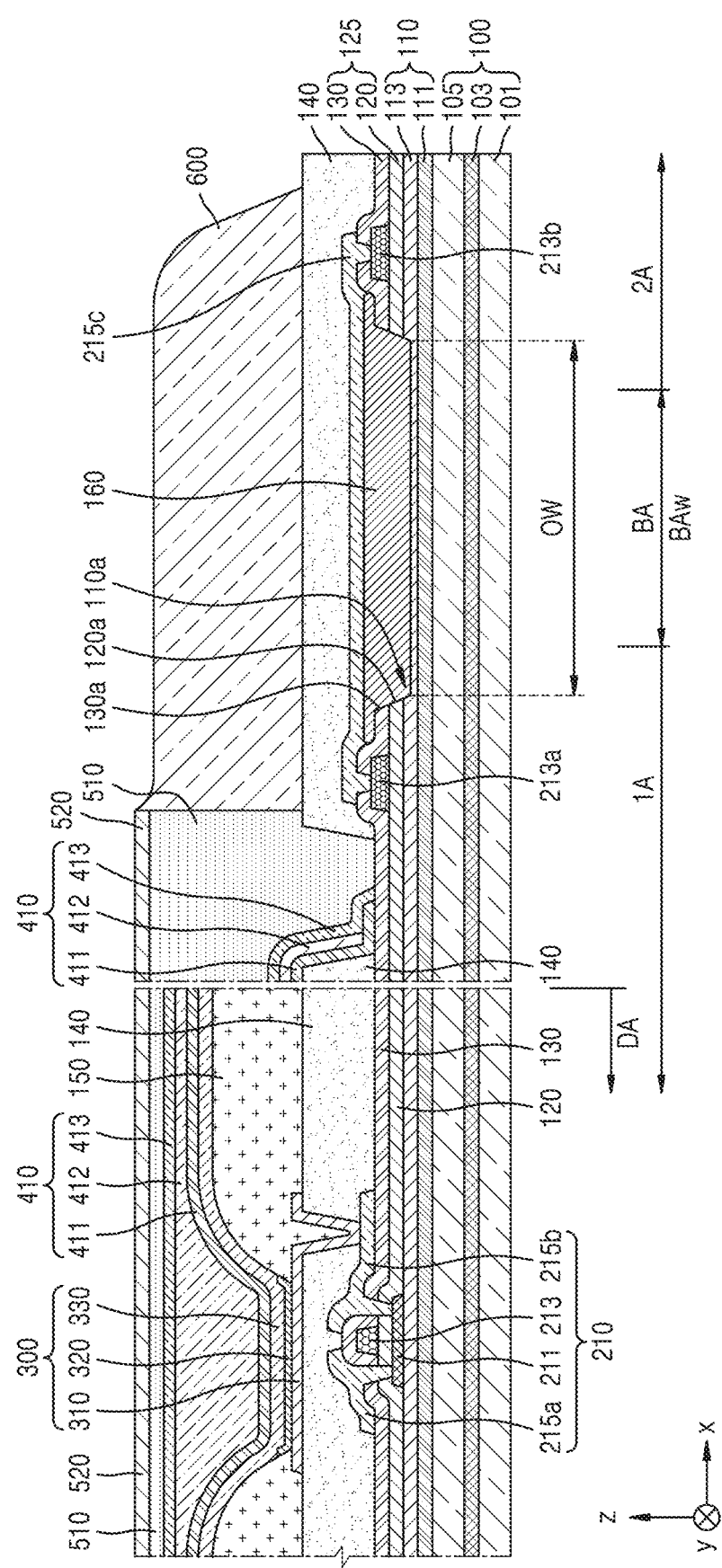
FIG. 2 is a cross-sectional view illustrating the part of the display device of FIG. 1 in a non-bent status.
Figure 3:
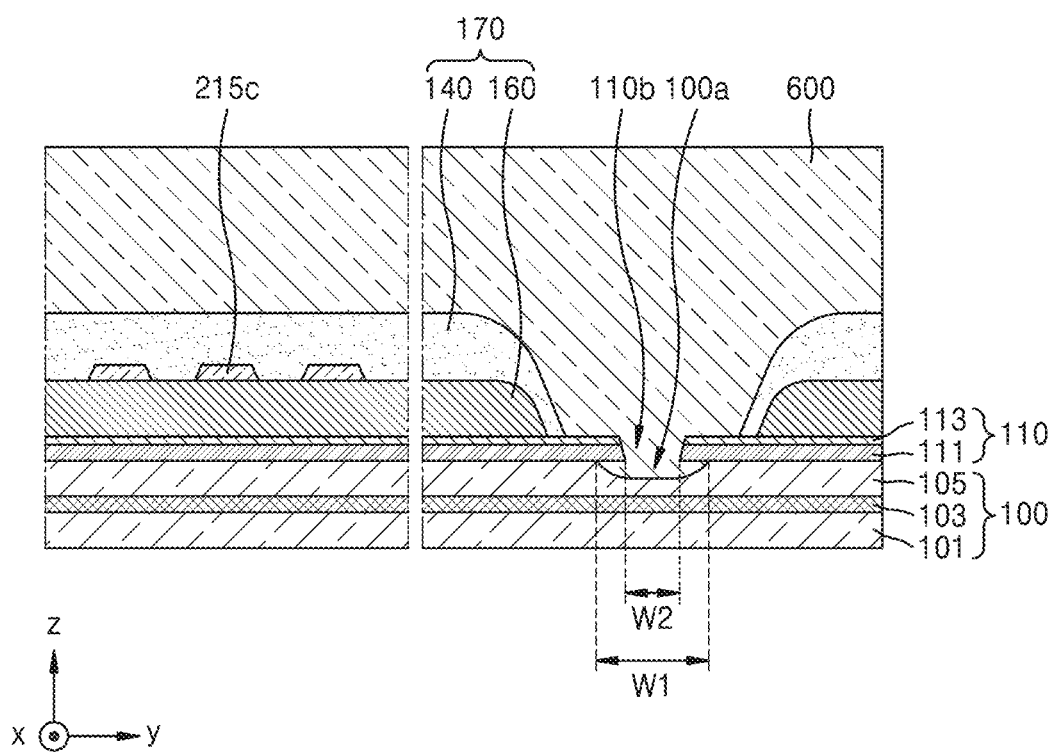
FIG. 3 is a cross-sectional view illustrating the part of the display device of FIG. 1 in a different direction from FIG. 2.

FIG. 1 is a perspective view illustrating a part of a display device according to an exemplary embodiment of the present disclosure. FIG. 2 is a cross-sectional view illustrating the part of the display device of FIG. 1 in a non-bent status. FIG. 3 is a cross-sectional view illustrating the part of the display device of FIG. 1 in a different direction from FIG. 2.

As shown in FIG. 1, A display device (especially, a substrate 100 referring to FIGS. 2 and 3) according to an exemplary embodiment has a bending area BA extending in a first direction (e.g., a +y direction) and is bent in the bending area BA. For convenience of illustration and convenience of explanation, the substrate 100 in FIG. 2 is illustrated as a non-bent status. In a process of manufacturing the display device, the display device illustrated in FIG. 2 is bent in the bending area BA as shown in FIG. 1. FIG. 2 is a cross-sectional view illustrating a first area 1A, the bending area BA, and a second area 2A. For convenience of illustration and convenience of explanation, the substrate 100 in FIG. 3 is illustrated as a non-bent status. FIG. 3 is a cross-sectional view taken in a direction parallel to a bending axis BAX in the bending area BA.

The substrate 100 has a substantially flat shape before being bent in a manufacturing process of the display device, and when the substrate 100 has a flat shape, the bending area BA is disposed between the first area 1A and the second area 2A in a second direction (e.g., a +x direction) intersecting with the first direction. The substrate 100 is bent along the bending axis BAX that extends in the first direction (e.g., the +y direction) as shown in FIG. 1. Although the first area 1A has a substantially rectangular shape in an x-y plane (i.e., a plane defined by the x direction and y direction) in FIG. 1, the present disclosure is not limited thereto. Various modifications may be made. In another exemplary embodiment, for example, the first area 1A may have a substantially circular shape. This applies to the following exemplary embodiments and modifications thereof.

The substrate 100 may include various flexible or bendable materials. In an exemplary embodiment, for example, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. Various modifications may be made. For example, the substrate 100 may have a multi-layer structure including two layers 101 and 105 that include a polymer resin and a barrier layer 103 that includes an inorganic material and is between the layers 101 and 105, as shown in FIGS. 2 and 3. In this case, the barrier layer 103 may include silicon oxide, silicon nitride, and/or silicon oxynitride.

Although widths of the first area 1A, the bending area BA, and the second area 2A of the substrate 100 along the y-axis are illustrated as not the same in FIG. 1, the present disclosure is not limited thereto. In another exemplary embodiment, for example, widths of the first area 1A, the bending area BA, and the second area 2A of the substrate 100 along the y-axis may be the same. In FIG. 1, a width in a y-axis direction is constant at the first area 1A except for a portion of the first area 1A adjacent to the bending area BA, decreases gradually at the portion of the first area 1A adjacent to the bending area BA and at a portion of the bending area BA adjacent to the first area 1A along the second direction (e.g., the +x direction) in the non-bent status (referring to FIG. 6), and is constant at a portion of the bending area BA adjacent to the second area 2A and at the second area 2A.

The first area 1A includes a display area DA. The first area 1A may also include a part of a non-display area outside the display area DA as shown in FIG. 2. The second area 2A and the bending area BA also include a non-display area. The non-display area is an area except for the display area DA in the display device.

Not only a display element 300 but also a thin-film transistor ("TFT") 210 to which the display element 300 is electrically connected may be located in the display area DA of the substrate 100 as shown in FIG. 2. In FIG. 2, an organic light-emitting element is located as the display element 300 in the display area DA. When the organic light-emitting element is electrically connected to the TFT 210, it may mean that a pixel electrode 310 is electrically connected to the TFT 210.

The TFT 210 may include a semiconductor layer 211 including amorphous silicon, polycrystalline silicon, or an organic semiconductor material, a gate electrode 213, a source electrode 215a, and a drain electrode 215b. In order to ensure insulation between the semiconductor layer 211 and the gate electrode 213, a gate insulating film 120 may be disposed between the semiconductor layer 211 and the gate electrode 213. The gate insulating film 120 may include an inorganic material such as silicon oxide, silicon nitride, and/or silicon oxynitride. An interlayer insulating film 130 may be located on the gate electrode 213. The interlayer insulating film 130 may include an inorganic material such as silicon oxide, silicon nitride, and/or silicon oxynitride. The source electrode 215a and the drain electrode 215b may be located on the interlayer insulating film 130. An insulating film including an inorganic material may be provided by using chemical vapor deposition ("CVD") or atomic layer deposition ("ALD"). This applies to the following exemplary embodiments and modifications thereof.

A barrier layer 111 and a buffer layer 113 which include an inorganic material such as silicon oxide, silicon nitride, and/or silicon oxynitride may be disposed between the TFT 210 and the substrate 100. The barrier layer 111 and the buffer layer 113 may increase a degree of flatness of a top surface of the substrate 100, or may prevent or minimize the penetration of impurities from the substrate 100 or the like into the semiconductor layer 211 of the TFT 210. The barrier layer 111 and the buffer layer 113 may be collectively referred to as an inorganic insulating layer 110.

A planarization layer 140 may be located on the TFT 210. For example, when the organic light-emitting element is located on the TFT 210 as shown in FIG. 2, the planarization layer 140 may substantially planarize a top surface of a protective film covering the TFT 210. The planarization layer 140 may include or be formed of an organic material such as acryl, benzocyclobutene ("BOB"), or hexamethyldisiloxane ("HMDSO"). Although the planarization layer 140 is illustrated as to have a single-layer structure in FIG. 2, various modifications may be made. In another exemplary embodiment, the planarization layer 140 may have a multi-layer structure. As shown in FIG. 2, the planarization layer 140 may have an opening outside the display area DA such that a portion of the planarization layer 140 in the display area DA and a portion of the planarization layer 140 in the second area 2A and the bending area BA are physically separated from each other. This is to prevent external impurities from reaching the display area DA through the planarization layer 140.

In the display area DA of the substrate 100, the display element 300 may be located on the planarization layer 140. The display element 300 may be an organic light-emitting element including the pixel electrode 310, a counter electrode 330, and an intermediate layer 320 that includes an emission layer and is between the pixel electrode 310 and the counter electrode 330. The pixel electrode 310 is electrically connected to the TFT 210 by contacting any one of the source electrode 215a and the drain electrode 215b through an opening portion formed in the planarization layer 140 as shown in FIG. 2.

A pixel-defining film 150 may be located on the planarization layer 140. The pixel-defining film 150 defines a pixel by an opening corresponding to each sub-pixel, that is, an opening through which at least a central portion of the pixel electrode 310 is exposed. Also, as shown in FIG. 2, the pixel-defining film 150 prevents an arc or the like from occurring at an edge of the pixel electrode 310 by increasing a distance between the edge of the pixel electrode 310 and the counter electrode 330 located on the pixel electrode 310. The pixel-defining film 150 may include or be formed of an organic material such as polyimide or HMDSO.

Although the pixel-defining film 150 is located only in the first area 1A in FIG. 2, the present disclosure is not limited thereto. In another exemplary embodiment, for example, when the pixel-defining film 150 is formed, an insulating layer (not shown) using the same material as the pixel-defining film 150 may be formed on the planarization layer 140 in the bending area BA at the same time. This may apply to the following exemplary embodiments and modifications thereof.

The pixel electrode 310 of the organic light-emitting element may have a multi-layer structure including crystalline indium tin oxide ("ITO"). For example, the pixel electrode 310 may include a reflective layer that includes a metal such as aluminum (Al) or copper (Cu), and a transparent conductive layer that includes crystalline ITO and is located on the reflective layer. The counter electrode 330 may also include a transparent conductive layer.

The intermediate layer 320 of the organic light-emitting element may include a low-molecular weight material or a high-molecular weight material. When the intermediate layer 320 includes a low-molecular weight material, the intermediate layer 320 may have a structure in which a hole injection layer ("HIL"), a hole transport layer ("HTL"), an emission layer ("EML"), an electron transport layer ("ETL"), and an electron injection layer ("EIL") are stacked, and may include any of various organic materials such as copper phthalocyanine ("CuPc"), N,N'-di(naphthalene-1-yl)-N,N'-diphenyl-benzidine ("NPB"), or tris-8-hydroxyquinoline aluminum ("Alq3"). The layers may be formed by using vacuum deposition.

When the intermediate layer 320 includes a high-molecular weight material, the intermediate layer 320 may have a structure including an HTL and an EML. In this case, the HTL may include Poly(3,4-ethylenedioxythiophene) ("PEDOT"), and the EML may include a high-molecular weight material such as a poly-phenylenevinylene ("PPV")-based material or a polyfluorene-based material. The intermediate layer 320 may be formed by using screen printing, inkjet printing, laser induced thermal imaging ("LITI"), or the like.

However, the intermediate layer 320 according to the invention is not limited thereto, and may have any of various other structures. In another exemplary embodiment, the intermediate layer 320 may include a layer that is integrally formed over a plurality of pixel electrodes 310, or may include a layer that is patterned to correspond to each of a plurality of pixel electrodes 310.

The counter electrode 330 may be located in the display area DA, to cover the display area DA as shown in FIG. 2. That is, the counter electrode 330 may be integrally formed over a plurality of organic light-emitting elements to correspond to the plurality of pixel electrodes 310.

Because the organic light-emitting element may be easily damaged by external moisture or oxygen, an encapsulation layer 410 may cover and protect the organic light-emitting element. The encapsulation layer 410 may cover the display area DA and may extend to the outside of the display area DA. The encapsulation layer 410 may include a first inorganic encapsulation layer 411, an organic encapsulation layer 412, and a second inorganic encapsulation layer 413 as shown in FIG. 2.

The first inorganic encapsulation layer 411 may cover the counter electrode 330 and may include silicon oxide, silicon nitride, and/or silicon oxynitride. In another exemplary embodiment, other layers such as a capping layer may be disposed between the first inorganic encapsulation layer 411 and the counter electrode 330. Because the first inorganic encapsulation layer 411 is disposed along a contour of the lower structure, a top surface of the first inorganic encapsulation layer 411 is not flat as shown in FIG. 2. The organic encapsulation layer 412 may cover the first inorganic encapsulation layer 411, to have a substantially flat top surface, different from the first inorganic encapsulation layer 411. In detail, a top surface of a portion of the organic encapsulation layer 412 corresponding to the display area DA may be substantially flat. In an exemplary embodiment, the organic encapsulation layer 412 may include at least one material selected from the group consisting of polyethylene terephthalate, polyethylene naphthalate, polycarbonate, polyimide, polyethylene sulfonate, polyoxymethylene, polyarylate, and hexamethyldisiloxane. The second inorganic encapsulation layer 413 may cover the organic encapsulation layer 412 and may include silicon oxide, silicon nitride, and/or silicon oxynitride. An edge of the second inorganic encapsulation layer 413 outside the display area DA may contact the first inorganic encapsulation layer 411 such that the organic encapsulation layer 412 is not exposed to the outside.

Because the encapsulation layer 410 includes the first inorganic encapsulation layer 411, the organic encapsulation layer 412, and the second inorganic encapsulation layer 413, even if cracks occur in the encapsulation layer 410 through such a multi-layer structure, the cracks may not be connected between the first inorganic encapsulation layer 411 and the organic encapsulation layer 412 or between the organic encapsulation layer 412 and the second inorganic encapsulation layer 413. Accordingly, the formation of a path through which external moisture or oxygen penetrates into the display area DA may be prevented or minimized.

A polarizer 520 may be located on the encapsulation layer 410 by using an optically clear adhesive ("OCA") 510. The polarizer 520 may reduce the reflection of external light. In another exemplary embodiment, the polarizer 520 may be disposed on the encapsulation layer 410 without using the OCA 510.

For example, the polarizer 520 may include a linear polarizer that passes only light that is linearly polarized in one direction and a λ/4 wave plate that is located under the linear polarizer and converts linearly polarized light into circularly polarized light. External light passes through the polarizer 520, is reflected by a top surface of the counter electrode 330, and then enters the polarizer 520 again. In this case, the external light first passes through the linear polarizer and then passes through the λ/4 wave plate twice. When the light enters the linear polarizer again, the light becomes linearly polarized in a direction such that the light may not pass through the linear polarizer. As a result, the reflection of external light may be reduced, thereby improving the visibility of the display device.

The OCA 510 and the polarizer 520 may cover the opening formed in the planarization layer 140 as shown in FIG. 2. The display device according to an exemplary embodiment does not always include the polarizer 520. In another exemplary embodiment, the polarizer 520 may be omitted and other elements may be used instead of the polarizer 520. For example, the polarizer 520 may be omitted, and a black matrix and a color filter may be used to reduce the reflection of external light.

The gate insulating film 120 and the interlayer insulating film 130 which includes an inorganic material may be collectively referred to as an inorganic insulating film 125. The inorganic insulating film 125 has an opening portion corresponding to the bending area BA as shown in FIG. 2. That is, the gate insulating film 120 and the interlayer insulating film 130 may have opening portions 120a and 130a corresponding to the bending area BA, respectively. When an opening portion corresponds to the bending area BA, it may mean that the opening portion overlaps the bending area BA. In this case, an area of the opening portion may be greater than that of the bending area BA. To this end, FIG. 2 shows that a width OW of the opening portion is greater than a width BAw of the bending area BA. The area of the opening portion may be defined as an area of the smallest between areas of the opening portion 120a formed in the gate insulating film 120 and the opening portion 130a formed in the interlayer insulating film 130.

As shown in FIG. 2, a part of an upper portion of the inorganic insulating layer 110 located under the inorganic insulating film 125, that is, a part of an upper portion of the buffer layer 113, may also be removed when the opening portion is formed in the inorganic insulating film 125. As shown in FIG. 2, a thickness (i.e., length in the z direction) of a portion of the buffer layer 113 corresponding to the opening portion of the inorganic insulating film 125 is small. That is, a thickness of the inorganic insulating layer 110 at the bending area BA may be less than a thickness of the inorganic insulating layer 110 at the center of the first area 1A. In this case, an area of a portion 110a of the inorganic insulating layer 110 having the small thickness may be defined as an area of the opening portion of the inorganic insulating film 125. FIG. 2 shows that the portion 110a of the inorganic insulating layer 110 having the small thickness defines the opening portion of the inorganic insulating film 125.

For reference, in a manufacturing process, the opening portion 120a of the gate insulating film 120 and the opening portion 130a of the interlayer insulating film 130 may be simultaneously formed. Because contact holes passing through the gate insulating film 120 and the interlayer insulating film 130 are formed such that the source electrode 215a and the drain electrode 215b contact the semiconductor layer 211 when the TFT 210 is formed, when the contact holes are formed, the opening portion 120a of the gate insulating film 120 and the opening portion 130a of the interlayer insulating film 130 may be simultaneously formed. Accordingly, an inner side surface of the opening portion 120a of the gate insulating film 120 and an inner side surface of the opening portion 130a of the interlayer insulating film 130 may form a continuous surface as shown in FIG. 2. When the opening portions are formed, a part of the upper portion of the inorganic insulating layer 110 may also be removed.

The display device according to an exemplary embodiment includes an organic layer 160 that fills at least a part of the opening portion of the inorganic insulating film 125. In FIG. 2, the organic layer 160 entirely fills the opening portion (i.e., the opening portion 130a, the opening portion 120a, and the portion 110a). The display device according to an exemplary embodiment includes a first conductive layer 215c, and the first conductive layer 215c extends from the first area 1A through the bending area BA to the second area 2A and is located on the organic layer 160. At a position where the organic layer 160 is not present, the first conductive layer 215c may be located on the inorganic insulating film 125 such as the interlayer insulating film 130. The first conductive layer 215c may be simultaneously formed by using the same material as the source electrode 215a or the drain electrode 215b.

Although the display device is not bent in FIG. 2 for convenience, the substrate 100 or the like in the display device according to the present exemplary embodiment is actually bendable in the bending area BA as shown in FIG. 1. To this end, in a manufacturing process, the display device is manufactured in a state where the substrate 100 is substantially flat as shown in FIG. 2, and then the display device has such a shape as shown in FIG. 1 by bending the substrate 100 or the like in the bending area BA. In this case, although tensile stress may be applied to the first conductive layer 215c during a process of bending the substrate 100 or the like in the bending area BA, the display device according to the present exemplary embodiment may prevent or minimize defects from occurring in the first conductive layer 215c during the bending process.

If the inorganic insulating film 125 such as the gate insulating film 120 and/or the interlayer insulating film 130 does not have the opening portion in the bending area BA and has a continuous shape extending from the first area 1A to the second area 2A, and the first conductive layer 215c is located on the inorganic insulating film 125, high tensile stress is applied to the first conductive layer 215c in a process of bending the substrate 100 or the like. In particular, because a hardness of the inorganic insulating film 125 is greater than that of the organic layer, cracks are likely to occur in the inorganic insulating film 125 in the bending area BA, and once cracks occur in the inorganic insulating film 125, cracks also occur in the first conductive layer 215c on the inorganic insulating film 125 and thus the probability of defects such as disconnection of the first conductive layer 215c is very high.

In contrast, in the display device according to an exemplary embodiment of the present invention, the inorganic insulating film 125 has the opening portion in the bending area BA, and a portion of the first conductive layer 215c in the bending area BA is located on the organic layer 160 that fills at least a part of the opening portion of the inorganic insulating film 125. Because the inorganic insulating film 125 has the opening portion in the bending area BA, cracks are unlikely to occur in the inorganic insulating film 125, and because the organic layer 160 includes an organic material, cracks are unlikely to occur in the organic layer 160. Accordingly, cracks are effectively prevented or minimized from occurring in a portion of the first conductive layer 215c in the bending area BA located on the organic layer 160. Because a hardness of the organic layer 160 is less than that of the inorganic insulating film 125, the organic layer 160 may absorb tensile stress generated when the substrate 100 or the like is bent, thereby effectively minimizing concentration of the tensile stress on the first conductive layer 215c.

Although the inorganic insulating layer 110 formed of an inorganic material exists in the bending area BA, because a thickness of the inorganic insulating layer 110 is relatively small, the probability that defects occur due to bending is very low. In particular, because a thickness of the inorganic insulating layer 110 in the bending area BA is less than a total thickness of the inorganic insulating layer 110 and the inorganic insulating film 125 in the first area 1A as described above, the substrate 100 or the like may be smoothly bent and defects may be effectively prevented. In addition, because the organic layer 160 exists in the bending area BA and the first conductive layer 215c is located on the organic layer 160, the first conductive layer 215c may be effectively prevented from being damaged by bending.

The display device according to an exemplary embodiment may include second conductive layers 213a and 213b in addition to the first conductive layer 215c. The second conductive layers 213a and 213b may be located in the first area 1A and the second area 2A, respectively, and be located in a layer different from a layer in which the first conductive layer 215c is located. The second conductive layers 213a and 213b may be electrically connected to the first conductive layer 215c. In FIG. 2, the second conductive layers 213a and 213b are located on the same layer (i.e., on the gate insulating film 120) and include the same material as the gate electrode 213 of the TFT 210. The first conductive layer 215c contacts the second conductive layers 213a and 213b through the contact hole of the interlayer insulating film 130. In addition, the second conductive layer 213a is located in the first area 1A, and the second conductive layer 213b is located in the second area 2A.

The second conductive layer 213a located in the first area 1A may be electrically connected to the TFT 210 or the like in the display area DA, and thus, the first conductive layer 215c may be electrically connected to the TFT 210 or the like in the display area DA through the second conductive layer 213a. The second conductive layer 213b located in the second area 2A may also be electrically connected to the TFT 210 or the like in the display area DA by the first conductive layer 215c. The second conductive layers 213a and 213b may be located outside the display area DA and may be electrically connected to elements located in the display area DA, or the second conductive layers 213a and 213b may be located outside the display area DA and may extend to the display area DA such that at least a part of the second conductive layers 213a and 213b is located inside the display area DA.

Although the display device is not bent in FIG. 2 for convenience, the substrate 100 or the like in the display device according to the present exemplary embodiment is actually bendable in the bending area BA as shown in FIG. 1. To this end, in a manufacturing process, the display device is manufactured in a state where the substrate 100 is substantially flat as shown in FIG. 2, and then the display device has such a shape as shown in FIG. 1 by bending the substrate 100 or the like in the bending area BA. In this case, tensile stress may be applied to the first conductive layer 215c during a process of bending the substrate 100 or the like in the bending area BA.

Accordingly, the first conductive layer 215c crossing the bending area BA may include a material having a high elongation, to prevent cracks from occurring in the first conductive layer 215c or defects such as disconnection from occurring in the first conductive layer 215c. The second conductive layers 213a and 213b including a material having an elongation lower than that of the first conductive layer 215c and electrical/physical characteristics different from those of the first conductive layer 215c may be disposed in the first area 1A or the second area 2A, to improve the efficiency of electrical signal transmission in the display device or reduce defects in a manufacturing process.

For example, the second conductive layers 213a and 213b may include molybdenum, and the first conductive layer 215c may include aluminum. In an exemplary embodiment, the first conductive layer 215c or the second conductive layers 213a and 213b may have a multi-layer structure. For example, the first conductive layer 215c may have a multi-layer structure including a titanium layer, an aluminum layer, and a titanium layer, and the second conductive layers 213a and 213b may have a multi-layer structure including a molybdenum layer and a titanium layer. However, the present disclosure according to the invention is not limited thereto. In another exemplary embodiment, the first conductive layer 215c may extend to the display area DA and may be directly connected to the source electrode 215a, the drain electrode 215b, or the gate electrode 213 of the TFT 210. Also, in still another exemplary embodiment, different from in FIG. 2, various modifications may be made. For example, a conductive layer that is formed at the same time by using the same material as the gate electrode 213 may be located on the organic layer 160 and may extend to the display area DA.

As shown in FIG. 2, the organic layer 160 may cover an inner side surface of the opening portion of the inorganic insulating film 125. The first conductive layer 215c may be formed at the same time with the source electrode 215a and the drain electrode 215b and include the same material as the source electrode 215a and the drain electrode 215b as described above. To this end, the source electrode 215a, the drain electrode 215b, and the first conductive layer 215c may be provided by forming a conductive layer over an entire surface of the substrate 100 (more specifically, over an entire surface of the interlayer insulating film 130) and patterning the conductive layer. In a case that the organic layer 160 does not cover the inner side surface of the opening portion 120a of the gate insulating film 120 or the inner side surface of the opening portion 130a of the interlayer insulating film 130, a conductive material may remain on the inner side surface of the opening portion 120a of the gate insulating film 120 or the inner side surface of the opening portion 130a of the interlayer insulating film 130 without being removed from the inner side surface in a process of patterning the conductive layer. In this case, the remaining conductive material may cause a short between different conductive layers. Accordingly, it is preferable that when the organic layer 160 is formed, the organic layer 160 covers the inner side surface of the opening portion of the inorganic insulating film 125.

To this end, as shown in FIG. 2, the organic layer 160 may have a different thickness according to a position, and a top surface of the organic layer 160 near the inner side surface of the opening portion 120a of the gate insulating film 120 or the inner side surface of the opening portion 130a defined in the interlayer insulating film 130 may be flat. Accordingly, in the process of patterning the conductive layer to form the source electrode 215a, the drain electrode 215b, and the first conductive layer 215c, the conductive material may be effectively prevented from remaining without being removed.

A bending protection layer ("BPL") 600 may be located outside the display area DA. That is, the BPL 600 may be located on the first conductive layer 215c to correspond to at least the bending area BA.

When a stack is bent, there is a stress neutral plane somewhere in the stack. The stress neutral plane may refer to a plane which does not receive a tensile or compressive stress or receive minimum stress in the stack when the stack is bent. In a case that the BPL 600 is not included, excessive tensile stress or the like may be applied to the first conductive layer 215c in the bending area BA when the substrate 100 or the like is bent. This is because a position of the first conductive layer 215c may not correspond to the stress neutral plane.

However, in an exemplary embodiment according to the invention, the BPL 600 may be provided and a position of the stress neutral plane may be adjusted in a stack including the substrate 100, the first conductive layer 215c, and the BPL 600 by adjusting a thickness, a modulus, etc. of the BPL 600. Accordingly, the stress neutral plane may be located near or over the first conductive layer 215c by the BPL 600, to minimize tensile stress applied to the first conductive layer 215c or to make compressive stress to be applied to the first conductive layer 215c. The BPL 600 may include or be formed of acryl or the like. When compressive stress is applied to the first conductive layer 215c, the probability that the first conductive layer 215c is damaged is much lower than that when tensile stress is applied.

Although an end of a top surface of the BPL 600 in a direction to the display area DA in the first area 1A is matched to a top surface of the polarizer 520 in a +z direction in FIG. 2, the present disclosure is not limited thereto. In another exemplary embodiment, for example, the end of the BPL 600 in the direction to the display area DA may cover a part of a top surface of an edge of the polarizer 520. In still another exemplary embodiment, the end of the BPL 600 in the direction to the display area DA may not contact the polarizer 520 and/or the OCA 510. In particular, in the latter case, in or after a process of forming the BPL 600, gas generated in the BPL 600 may be prevented from moving in the direction (e.g., a −x direction) toward the display area DA, thereby preventing the display element 300 such as an organic light-emitting element from being degraded by the gas.

When the end of the top surface of the BPL 600 in the direction to the display area DA is matched to the top surface of the polarizer 520 in the +z direction, the end of the BPL 600 in the direction to the display area DA covers a part of the top surface of the edge of the polarizer 520, or the end of the BPL 600 in the direction to the display area DA (e.g., the −x direction) contacts the OCA 510, a thickness (i.e., length in z-axis direction) of the end portion of the BPL 600 in the direction to the display area DA may be greater than a thickness of another portion of the BPL 600 as shown in FIG. 2. Because a paste material may be coated and cured to form the BPL 600, a volume of the BPL 600 may be reduced in a curing process. Therefore, if the end portion of the BPL 600 in the direction to the display area DA contacts the polarizer 520 and/or the OCA 510, since a position of the end portion of the BPL 600 is fixed, a volume reduction occurs in a remaining portion of the BPL 600. As a result, the thickness of the end portion of the BPL 600 in the direction to the display area DA may be greater than the thickness of another portion of the BPL 600.

Because the inorganic insulating film 125 has the opening portion corresponding to at least the bending area BA as described above, defects due to bending may be minimized. However, because the inorganic insulating layer 110 exists in the bending area BA even though the inorganic insulating layer 110 in the bending area BA has a small thickness, defects may occur in the inorganic insulating layer 110 of the bending area BA. In particular, because a part of the inorganic insulating layer 110 may be exposed at edges of the substrate 100 facing away each other in the y-axis direction in the bending area BA or a part of the inorganic insulating layer 110 is located near the edges of the substrate 100 facing away each other in the y-axis direction as shown in FIG. 3, stress may be concentrated on that part of the inorganic insulating layer 110 and defects of the display device may occur, when the substrate 100 or the like is bent in a manufacturing process. The left part of FIG. 3 illustrates a center portion of the substrate 100 in the bending area BA, and the right part of FIG. 3 illustrates the end portion of the substrate 100 in the +y direction in the bending area BA. The end portion of the inorganic insulating layer 110 is vulnerable to external impact even after manufacturing and may be easily damaged, thereby causing defects of the display device. Accordingly, in order to minimize the occurrence of defects, the display device according to an exemplary embodiment has a structure as shown in FIG. 3.

In detail, the substrate 100 includes a thin portion located at an edge portion of the bending area BA in the y-axis direction and having a thickness less than a thickness at the center of the bending area BA. Referring to FIG. 3, the thin portion of the substrate 100 defines a first groove 100a. The first groove 100a defined in the thin portion may extend from the second area 2A to the first area 1A (e.g., in the −x direction of the coordinate axis of FIG. 2). When the substrate 100 has a multi-layer structure including two layers 101 and 105 including a polymer resin and the barrier layer 103 including an inorganic material and located between the layers 101 and 105 as shown in FIG. 3, the layer 105 disposed in a direction to the inorganic insulating layer 110 may define the first groove 100a. Although FIG. 3 illustrates a central portion of the display device in the bending area BA in the left part and an edge portion of the display device in the +y direction in the bending area BA in the right part, an edge portion in the bending area BA in a −y direction may have a structure that is the same as or similar to that of the edge portion in the +y direction in the bending area BA. Here, the edge portion in the bending area BA in the +y direction may be referred to the rightmost portion of the bending area BA when the bending area BA is divided by five or four portions each portion of which has an equal length in the y-axis direction.

The inorganic insulating layer 110 located on the substrate 100 exposes the thin portion of the substrate 100 in the bending area BA. In FIG. 3, the inorganic insulating layer 110 defines a first opening 110b corresponding to the first groove 100a to expose the first groove 100a of the substrate 100. When the first opening 110b exposes the first groove 100a, it may not mean that the first opening 110b entirely exposes the first groove 100a but mean that the first opening 110b exposes at least a part of the first groove 100a. In FIG. 3, the first opening 110b exposes a central portion of the first groove 100a.

Because the substrate 100 has the first groove 100a and the inorganic insulating layer 110 has the first opening 110b, defects may be dramatically prevented or minimized. For example, because impact is likely to be applied to an edge in the +y direction or an edge in the −y direction in the bending area BA and a stress is concentrated in a bending process, cracks may occur in an edge of the inorganic insulating layer 110 in the +y direction or the −y direction in the bending area BA. In a case that the cracks grow to the central portion of the bending area BA, cracks may occur even in a wiring such as the first conductive layer 215c, thereby adversely affecting the display device.

However, in the display device according to an exemplary embodiment according to the invention, the substrate 100 has the first groove 100a and the inorganic insulating layer 110 has the first opening 110b. The first opening 110b extends along the edge of the substrate 100 (e.g., in the +x direction when a bent state is disregarded). Accordingly, even when cracks occur in the edge of the inorganic insulating layer 110 in the +y direction or the −y direction, the cracks may not grow to the central portion of the bending area BA and may stop near the first opening 110b. Accordingly, even when a stress is applied to the bending area BA in a manufacturing process or impact is applied to the outside of the bending area BA in the manufacturing process or a using process after the manufacturing process, defects due to the cracks in central portion of the display device may be effectively prevented or minimized.

As shown in FIG. 3, a width W1 of the first groove 100a of the substrate 100 in the y-axis direction may be greater than a width W2 of the first opening 110b of the inorganic insulating layer 110 in the y-axis direction. Accordingly, an inner side surface of the first opening 110b of the inorganic insulating layer 110 may protrude from an edge of the first groove 100a of the substrate 100 to the center of the first opening 110b. Accordingly, a portion of a bottom surface of the inorganic insulating layer 110 over the first opening 110b may be spaced apart from the substrate 100.

The organic layer 160 and the planarization layer 140 are located on the inorganic insulating layer 110 even in the bending area BA as shown in FIG. 3. The organic layer 160 and/or the planarization layer 140 may be referred to as an additional insulating layer 170, and the additional insulating layer 170 on the inorganic insulating layer 110 has an additional opening corresponding to the first opening 110b in the bending area BA as shown in FIG. 3. Because a width of the additional opening is greater than a width W2 of the first opening 110b, an inner side surface of the first opening 110b protrudes from an edge of the additional opening to the center of the first opening 110b. This applies to the following exemplary embodiments and modifications thereof.

Figure 4:
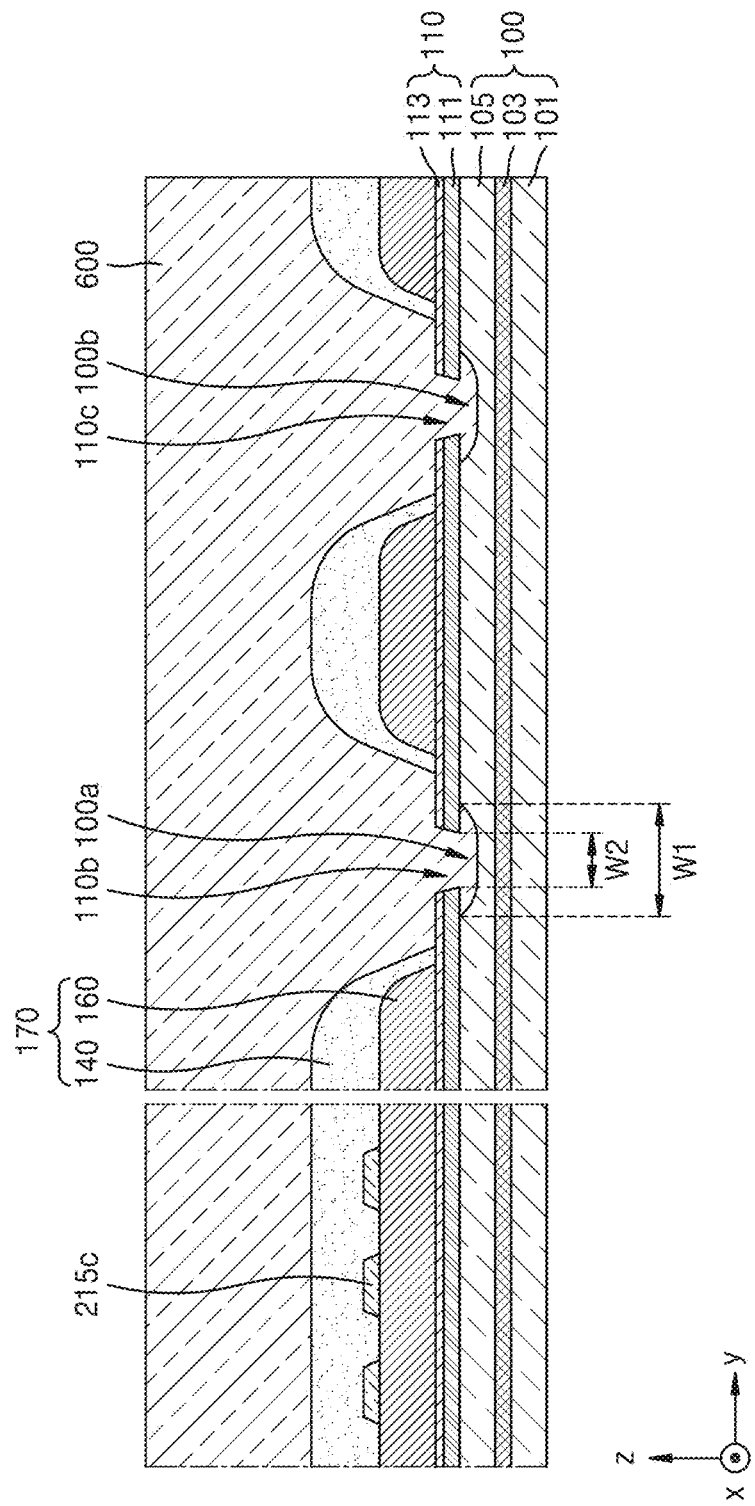
FIG. 4 is a cross-sectional view illustrating a part of a display device according to another exemplary embodiment of the present disclosure.

FIG. 4 is a cross-sectional view illustrating a part of a display device according to another exemplary embodiment of the present disclosure. The display device according to the present exemplary embodiment is different from the display device of FIG. 3 in that the substrate 100 has a second groove 100b in addition to the first groove 100a, and the inorganic insulating layer 110 has a second opening 110c in addition to the first opening 110b. The second groove 100b is disposed between an edge of the substrate 100 and the first groove 100a in the bending area BA, and extends from the second area 2A to the first area 1A (e.g., in the x-axis direction). The second opening 110c has a shape corresponding to the second groove 100b in the bending area BA. Because the display device includes the second groove 100b and the second opening 110c in addition to the first groove 100a and the first opening 110b, even when cracks occur in an edge of the inorganic insulating layer 110 in the +y direction or the −y direction in the bending area BA, defects may be effectively prevented from occurring in the display device.

In this case, a width of the second groove 100b of the substrate 100 in the y-axis direction may be greater than a width of the second opening 110c of the inorganic insulating layer 110 in the y-axis direction. Accordingly, an inner side surface of the second opening 110c of the inorganic insulating layer 110 may protrude from an edge of the second groove 100b of the substrate 100 to the center of the second opening 110c.

Figure 5:
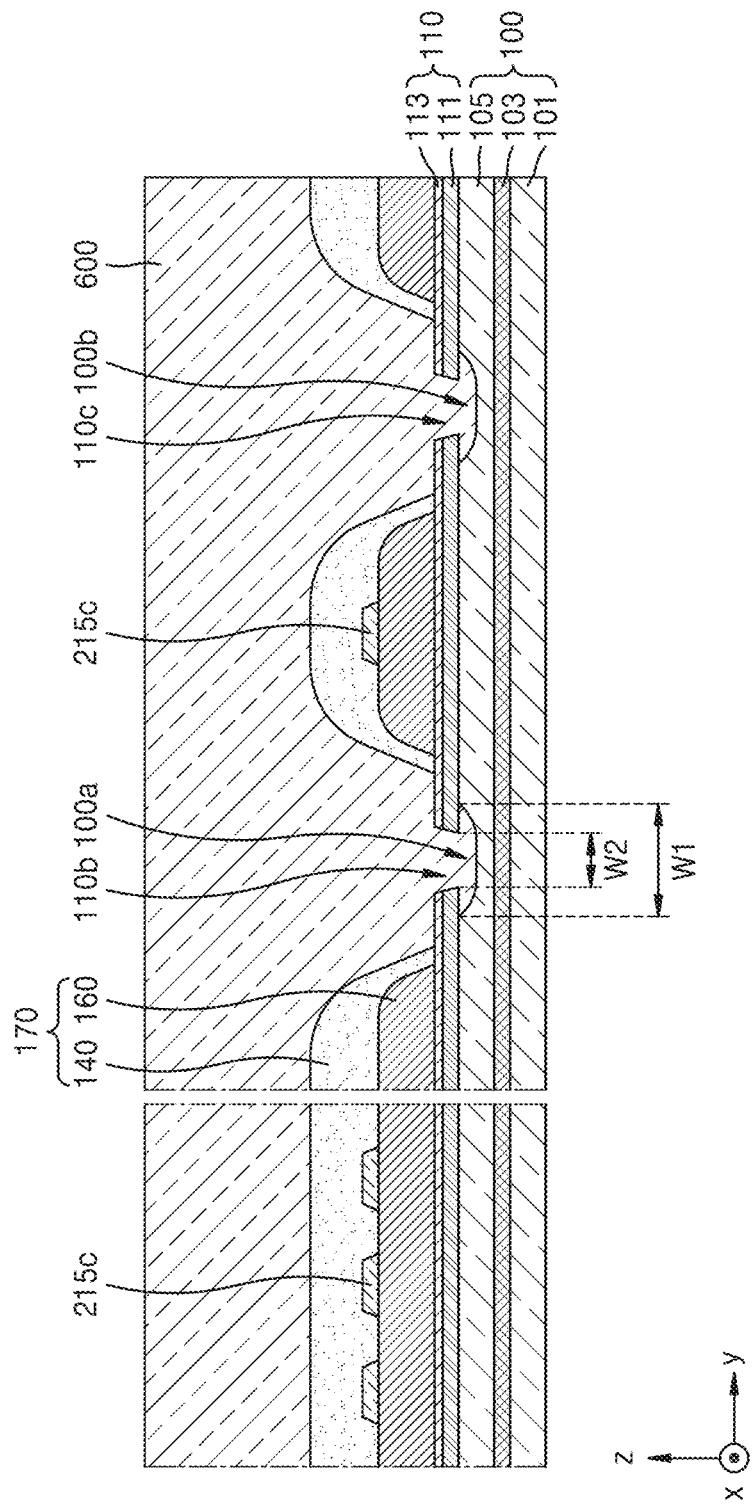
FIG. 5 is a cross-sectional view illustrating a part of a display device according to still another exemplary embodiment of the present disclosure.

As shown in FIGS. 3 and 4, the first conductive layer 215c that may be referred to as a wiring and located on the organic layer 160 and extend from the first area 1A through the bending area BA to the second area 2A is located on a central portion (in the y-axis direction) of the substrate 100 in the bending area BA. Although the first conductive layer 215c may not be between the first groove 100a and the second groove 100b of the substrate 100 in FIG. 4, the present disclosure according to the invention is not limited thereto. For example, as shown in FIG. 5 that is a cross-sectional view illustrating a part of a display device according to still another exemplary embodiment of the present disclosure, the first conductive layer 215c may be located on the organic layer 160 provided between the first groove 100a and the second groove 100b. Because the number of various wirings increases in a high-resolution display device, such a structure as shown in FIG. 5 may be used. This applies to the following exemplary embodiments and modifications thereof.

Figure 6:
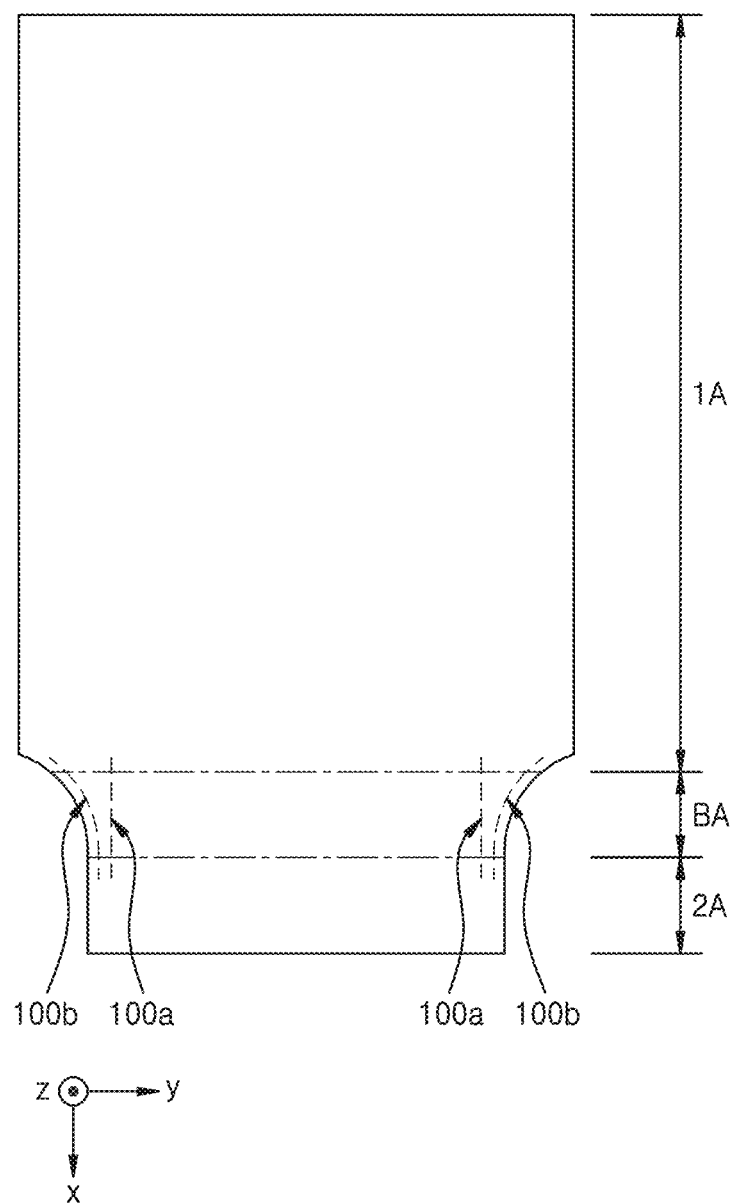
FIG. 6 is a plan view illustrating a part of a display device according to still another exemplary embodiment of the present disclosure.

FIG. 6 is a plan view illustrating a part of a display device according to still another exemplary embodiment of the present disclosure. The display device is not bent in FIG. 6. A cross-sectional view of FIG. 4 or 5 may be a cross-sectional view in the bending area BA of FIG. 6.

As shown in FIG. 6, the second groove 100b may not be parallel to the first groove 100a. That is, the first groove 100a may have a linear shape extending from the second area 2A to the first area 1A (e.g., x-axis direction), and the second groove 100b may have a curved shape extending from the second area 2A to the first area 1A.

For example, as shown in FIG. 6, the display device may have a shape having an edge that is concave in and near the bending area BA. That is, a width of the substrate 100 in the y-axis direction decreases gradually at a portion of the first area 1A adjacent to the bending area BA and at a portion of the bending area BA adjacent to the first area 1A along the second direction (e.g., the +x direction), and is constant at a portion of the bending area BA adjacent to the second area 2A and at the second area 2A.

In this case, the second groove 100b located closer to an edge of the substrate 100 than the first groove 100a may have a curved shape corresponding to a shape of the edge of the substrate 100. The first groove 100a that is not directly affected by the shape of the edge of the substrate 100 may have a substantially linear shape extending from the second area 2A to the first area 1A different from the second groove 100b, to effectively prevent cracks occurring in an edge of the inorganic insulating layer 110 (in the +y direction or the −y direction) from growing to a central portion of the bending area BA, or the first area 1A or the second area 2A.

In general, cracks occurring in the edge of the inorganic insulating layer 110 (in the +y direction or the −y direction) grow in a direction (e.g., the −y direction or the +y direction) substantially perpendicular to a straight line (parallel to the x-axis) that connects the first area 1A and the second area 2A. Accordingly, the first groove 100a which is substantially perpendicular to the direction in which the cracks grow may effectively prevent or minimize defects.

Figure 7:
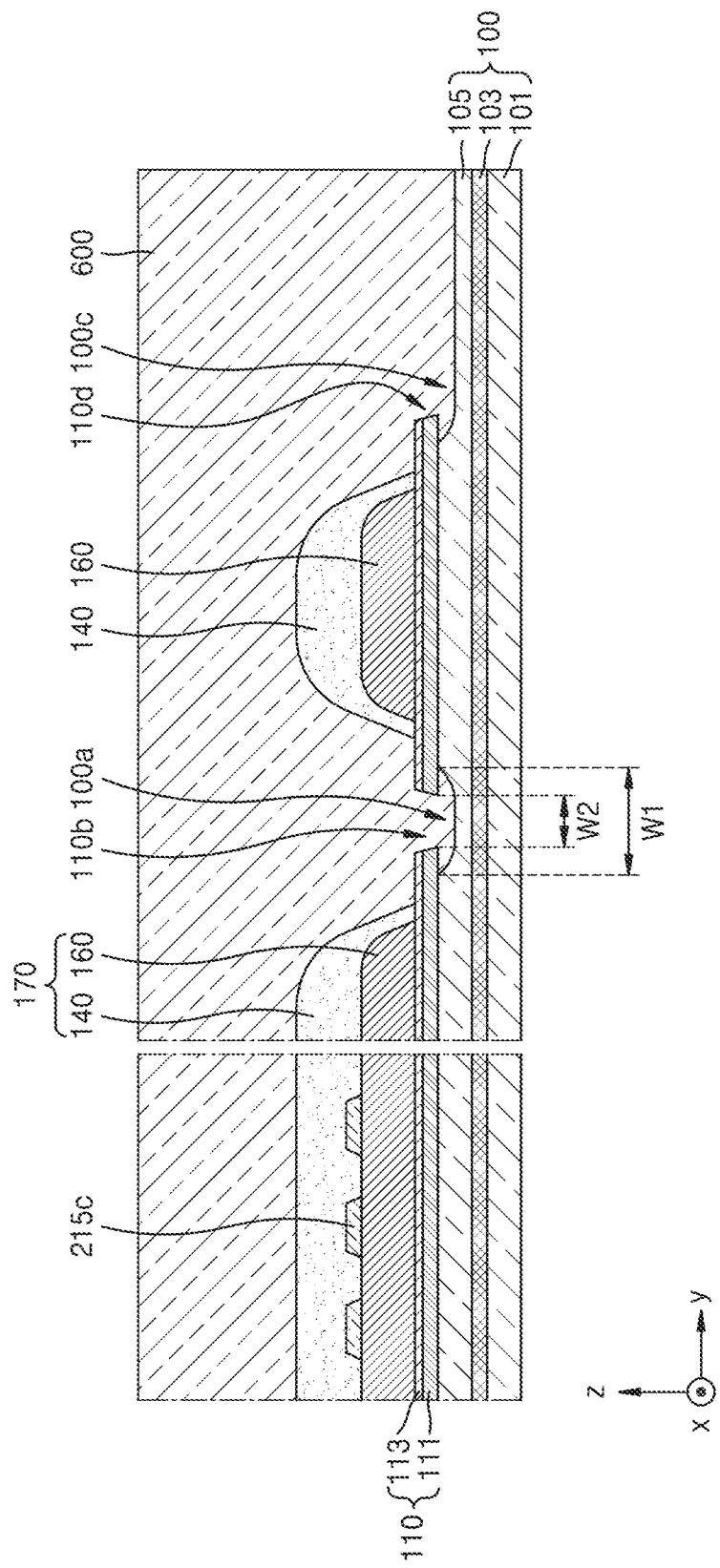
FIG. 7 is a cross-sectional view illustrating a part of a display device according to yet another exemplary embodiment of the present disclosure.

FIG. 7 is a cross-sectional view illustrating a part of a display device according to yet another exemplary embodiment of the present disclosure. The display device according to the present exemplary embodiment is different from the display device of FIG. 4 in that the substrate 100 does not include the second groove 100b. Instead, the substrate 100 includes a thin portion 100c outside the first groove 100a, and the thin portion 100c extends up to an end of the substrate 100 along a direction of the bending axis BAX (e.g., the +y direction).

In this case, an edge (i.e., the end) 110d of the inorganic insulating layer 110 close to or in a direction to the thin portion 100c (e.g., the +y direction) corresponds to an edge of the thin portion 100c close to or in a direction to the center of the bending area BA (e.g., the −y direction in FIG. 7). As shown in FIG. 7, the edge (i.e., the end) 110d of the inorganic insulating layer 110 in the direction to the thin portion 100c (e.g., the +y direction) may not be exactly matched to the edge of the thin portion 100c in a direction to the center of the bending area BA (e.g., the −y direction). That is, as shown in FIG. 7, the edge (i.e., the end) 110d of the inorganic insulating layer 110 close to or in a direction to the thin portion 100c (e.g., the +y direction) may protrude from the edge of the thin portion 100c close to or in a direction to the center of the bending area BA (e.g., the −y direction in FIG. 7) toward the center of the thin portion 100c (e.g., the +y direction), and a bottom surface of the edge portion (i.e., the end portion) of the inorganic insulating layer 110 close to or in the direction to the thin portion 100c may be spaced apart from the substrate 100 in the z-axis direction. Here, the edge portion (i.e., the end portion) of the inorganic insulating layer 110 includes the edge (i.e., the end) 110d of the inorganic insulating layer 110 and a part of the inorganic insulating layer 110 neighboring the edge (i.e., the end) 110d of the inorganic insulating layer 110.

Figure 8:
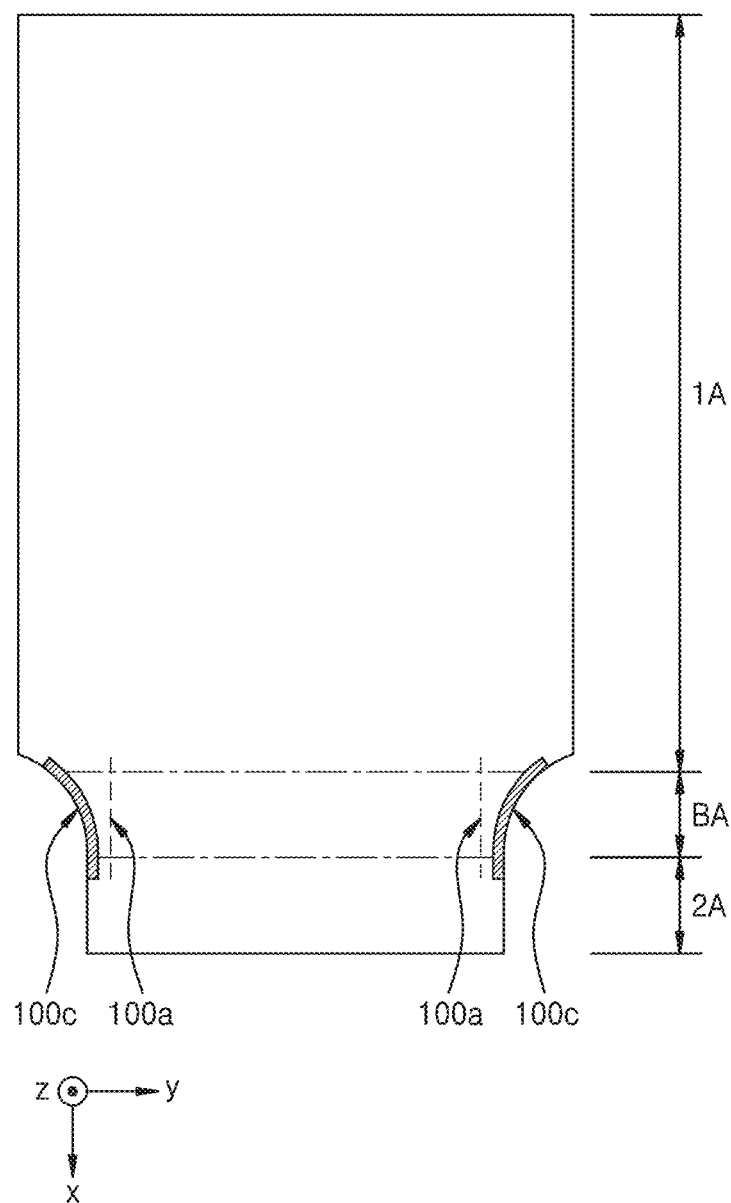
FIG. 8 is a plan view illustrating a part of a display device according to still another exemplary embodiment of the present disclosure.

The thin portion 100c may have a curved shape extending along an edge of the substrate 100 like the second groove 100b of FIG. 6, as shown in FIG. 8 that is a plan view illustrating a part of a display device according to still another exemplary embodiment of the present disclosure. In this case, the first groove 100a may have a linear shape extending from the second area 2A to the first area 1A.

Figure 9:
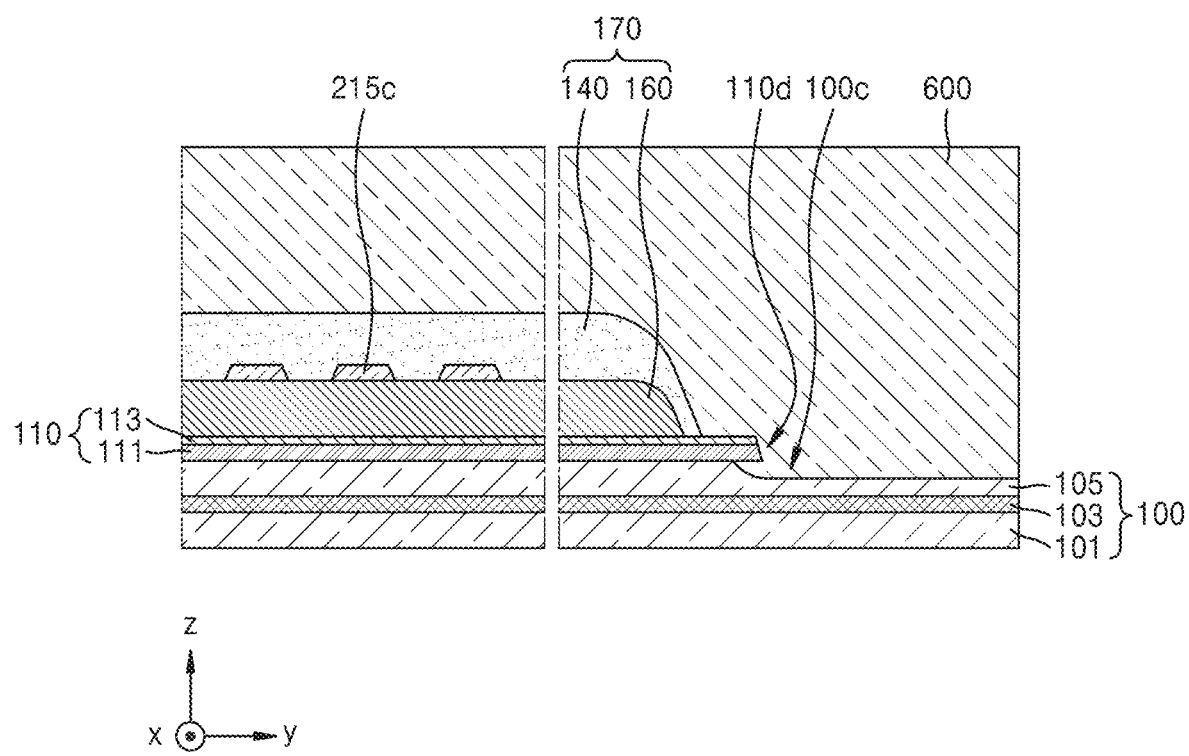
FIG. 9 is a cross-sectional view illustrating a part of a display device according to another exemplary embodiment of the present disclosure.

Although the substrate 100 includes the first groove 100a and also the thin portion 100c in FIG. 7, the present disclosure is not limited thereto. In another exemplary embodiment, for example, as shown in FIG. 9 that is a cross-sectional view illustrating a part of a display device according to another exemplary embodiment of the present disclosure, the substrate 100 may not have the first groove 100a and may include only the thin portion 100c. That is, the substrate 100 may include the thin portion 100c at an edge in the bending area BA (e.g., in the +y direction and the −y direction), and the thin portion 100c may extend along a direction of the bending axis BAX (e.g., the +y direction) up to an end of the substrate 100.

In this case, the edge 110d of the inorganic insulating layer 110 close to or in a direction to the thin portion 100c (e.g., the +y direction) corresponds to an edge of the thin portion 100c in a direction to the center of the bending area BA (e.g., the −y direction in FIG. 9). As shown in FIG. 9, the edge 110d of the inorganic insulating layer 110 close to or in the direction to the thin portion 100c (e.g., the +y direction) may not be exactly matched to the edge of the thin portion 100c in the direction to the center of the bending area BA (e.g., the −y direction). That is, as shown in FIG. 9, the edge 110d of the inorganic insulating layer 110 close to or in the direction to the thin portion 100c (e.g., the +y direction) may protrude from the edge of the thin portion 100c close to or in a direction to the center of the bending area BA (e.g., the −y direction in FIG. 9) toward the center of the thin portion 100c (the +y direction), and a bottom surface of the edge 110d of the inorganic insulating layer 110 close to or in the direction to the thin portion 100c may be spaced apart from the substrate 100 in the z-axis direction.

As shown in FIG. 9, the organic layer 160 and the planarization layer 140 are located on the inorganic insulating layer 110 even in the bending area BA. The organic layer 160 and/or the planarization layer 140 may be referred to as an additional insulating layer 170, and the additional insulating layer 170 on the inorganic insulating layer 110 exposes a top surface of the edge 110d of the inorganic insulating layer 110 close to or in a direction to the thin portion 100c in the bending area BA as shown in FIG. 9. This may apply to the following exemplary embodiments and modifications thereof as well as the exemplary embodiment of FIG. 7.

Figure 10:
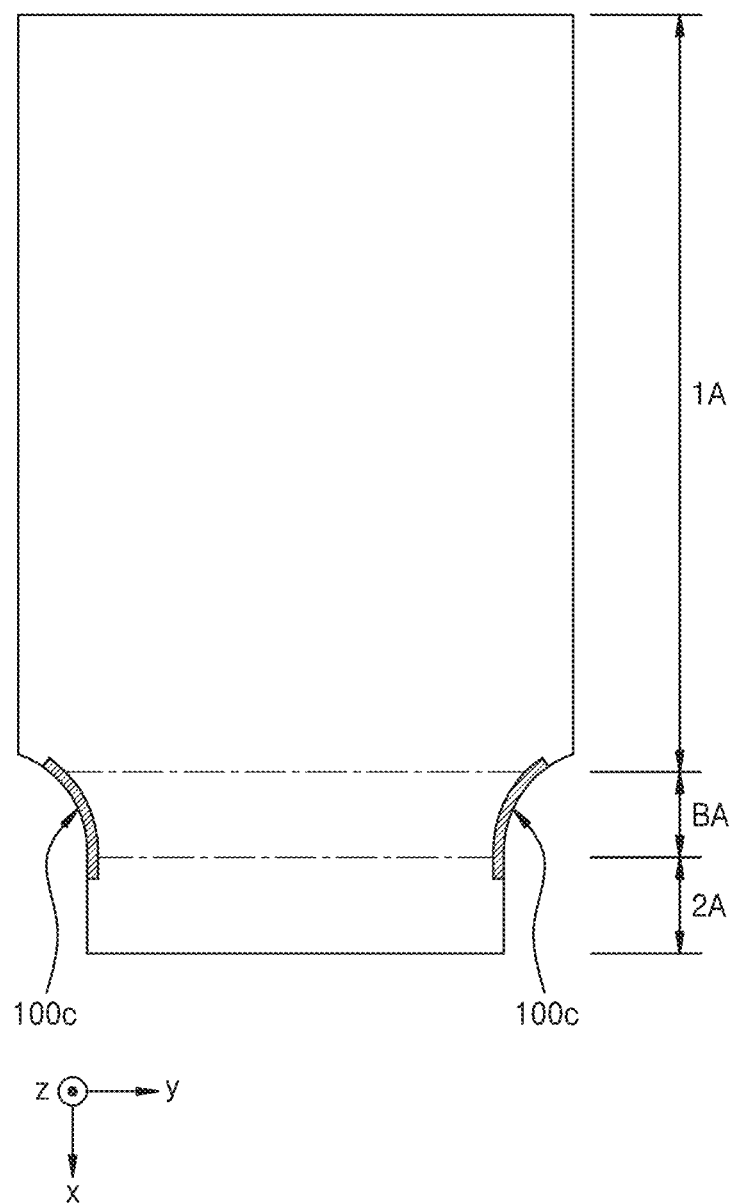
FIG. 10 is a plan view illustrating a part of a display device according to still another exemplary embodiment of the present disclosure.
Figure 11:
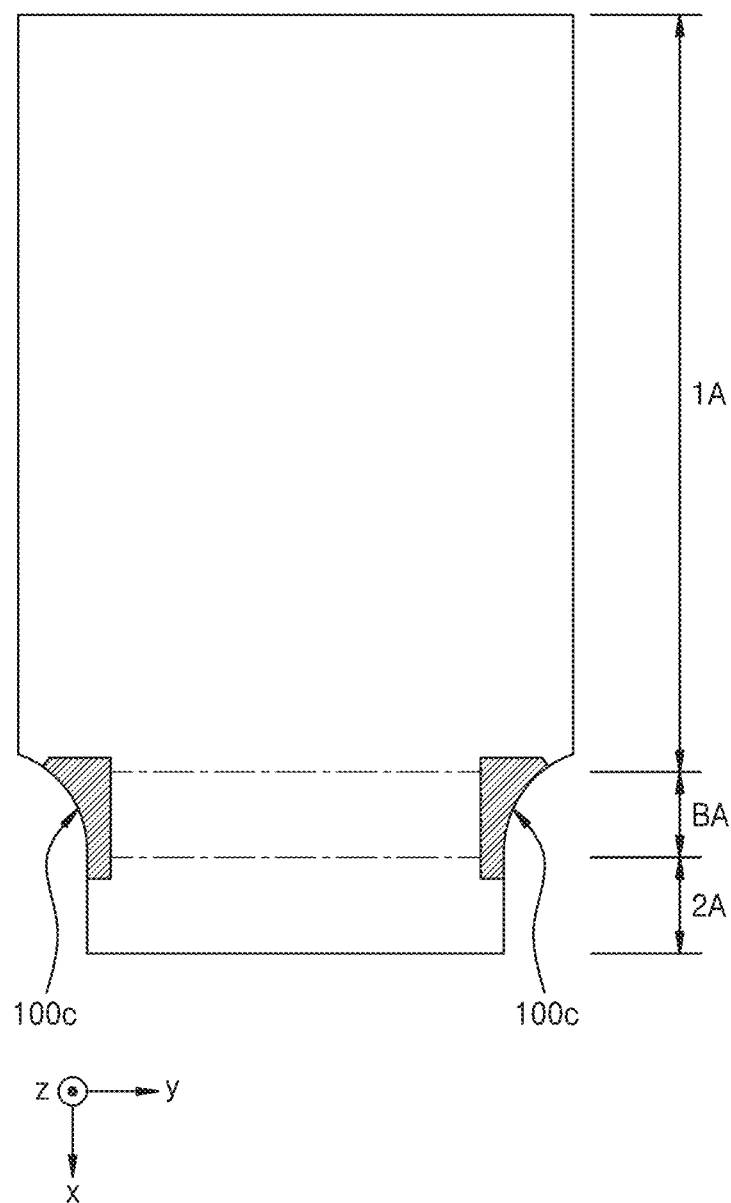
FIG. 11 is a plan view illustrating a part of a display device according to another exemplary embodiment of the present disclosure.
Figure 12:
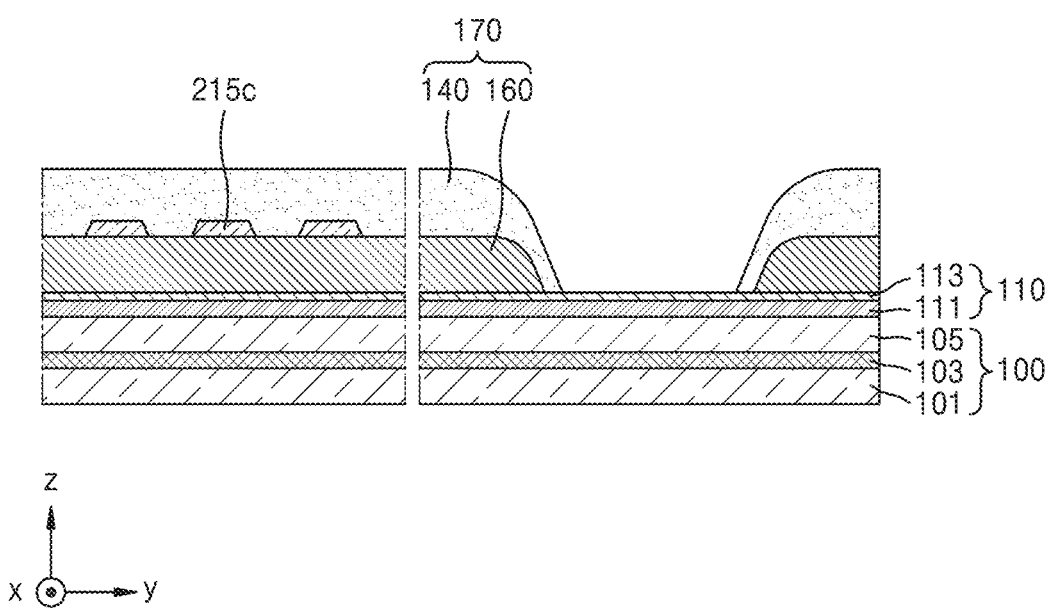
FIGS. 12 through 15 are cross-sectional views illustrating processes of a method of manufacturing a display device according to another exemplary embodiment of the present disclosure.

The thin portion 100c may have a curved shape extending along an edge of the substrate 100 like the second groove 100b of FIG. 6, as shown in FIG. 10 that is a plan view illustrating a part of a display device according to still another exemplary embodiment of the present disclosure. In another exemplary embodiment, the edge of the thin portion 100c in a direction to the center of the bending area BA may have a linear shape extending from the second area 2A to the first area 1A, as shown in FIG. 11 that is a plan view illustrating a part of a display device according to another exemplary embodiment of the present disclosure. In this case, the edge 110d of the inorganic insulating layer 110 close to or in a direction to the thin portion 100c may also have a linear shape extending from the second area 2A to the first area 1A. The end of the substrate 100 along the bending a direction of axis BAX (e.g., the +y direction or the −y direction) has a curved shape.

A method of forming the first groove 100a and the first opening 110b of FIG. 3, that is, a method of manufacturing a display device, will be described with reference to FIGS. 12 through 15. First, various layers are formed on the substrate 100, and the pixel electrode 310 (see FIG. 2) through the pixel-defining film 150 (see FIG. 2) are formed. Although not shown in FIG. 12 that is a cross-sectional view in the bending area BA, the pixel-defining film 150 may be located on the planarization layer 140 in the bending area BA.

Figure 13:
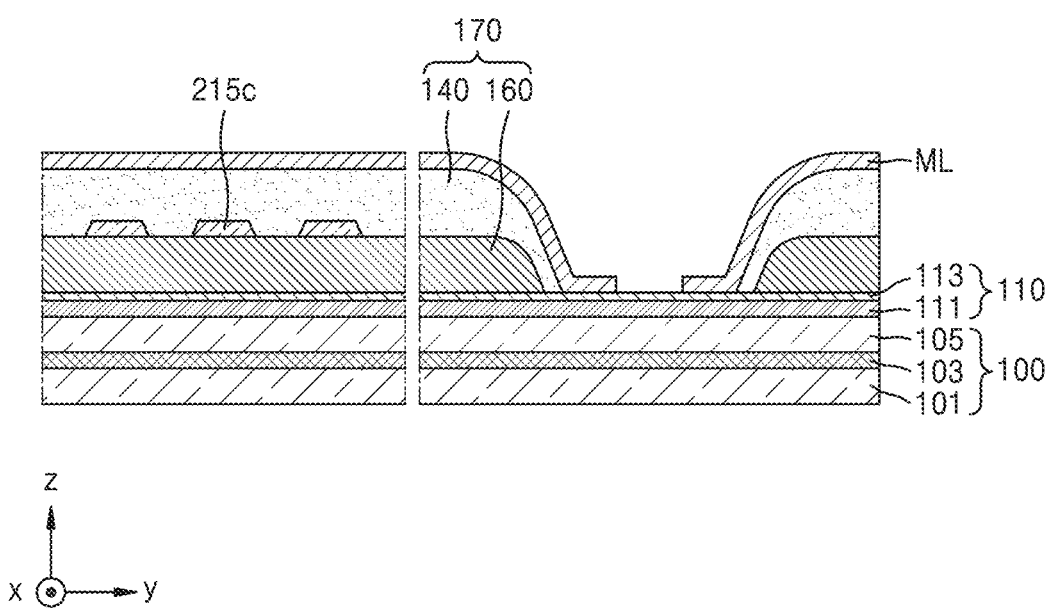

Next, a mask layer ML defining an open area is formed as shown in FIG. 13 by forming a layer on the planarization layer 140 and/or the pixel-defining film 150 and patterning the layer. The mask layer ML may include or be formed of indium zinc oxide ("IZO") or amorphous ITO. For example, the open area may be formed by forming a layer corresponding to an entire surface of the substrate 100 by using IZO or amorphous ITO and removing a part of the layer at a position where the first groove 100a is to be formed by using a photoresist.

Figure 14:
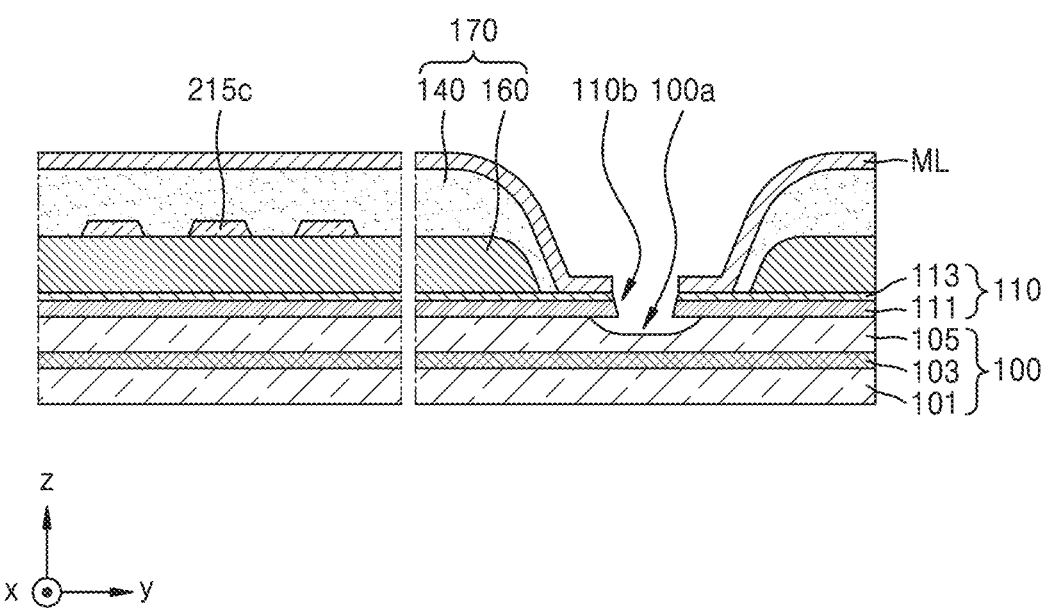

When dry etching is performed in this situation, the first opening 110b is formed from the inorganic insulating layer 110 by removing the inorganic insulating layer 110 at a portion corresponding to the open area of the mask layer ML as shown in FIG. 14, and when dry etching is further performed, the substrate 100 is undercut and the first groove 100a is formed from the substrate 100. The mask layer ML protects other elements that are previously formed in the display area DA, etc. during the dry etching.

Next, the display device of FIG. 3 may be manufactured by removing the mask layer ML of FIG. 14 by performing entire wet etching and then forming the intermediate layer 320 on the pixel electrode 310.

Because the mask layer ML is formed after the pixel electrode 310 and the pixel-defining film 150 are formed as described above, a portion of the pixel electrode 310 not covered by the pixel-defining film 150 contacts the mask layer ML. Accordingly, when the mask layer ML is removed by using wet etching, it is preferable not to damage the pixel electrode 310 or the like.

The mask layer ML is formed of IZO or amorphous ITO as described above. An etch rate of the IZO or the amorphous ITO is very different from an etch rate of crystalline ITO. The etch rate of the IZO or the amorphous ITO is also very different from an etch rate of silicon oxide, silicon nitride, or the like. Accordingly, even when the mask layer ML formed of IZO or amorphous ITO is removed by using wet etching, other elements including the pixel electrode 310 may not be damaged during the removal process.

The first groove 100a of the substrate 100 and the first opening 110b of the inorganic insulating layer 110 directly contact the BPL 600 in the above exemplary embodiments. However, the present disclosure is not limited thereto.

Figure 15:
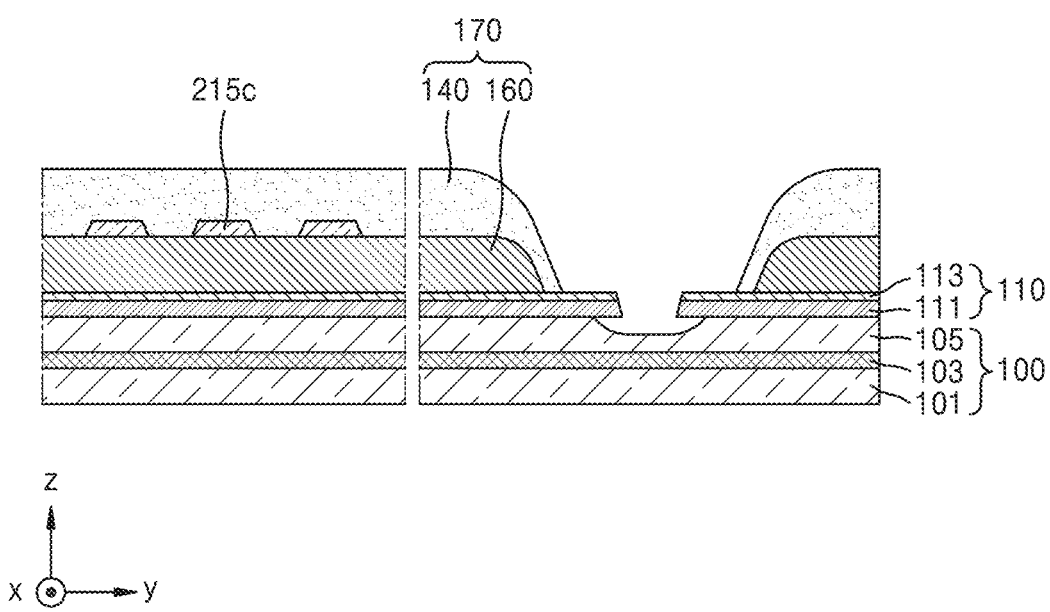
Figure 16:
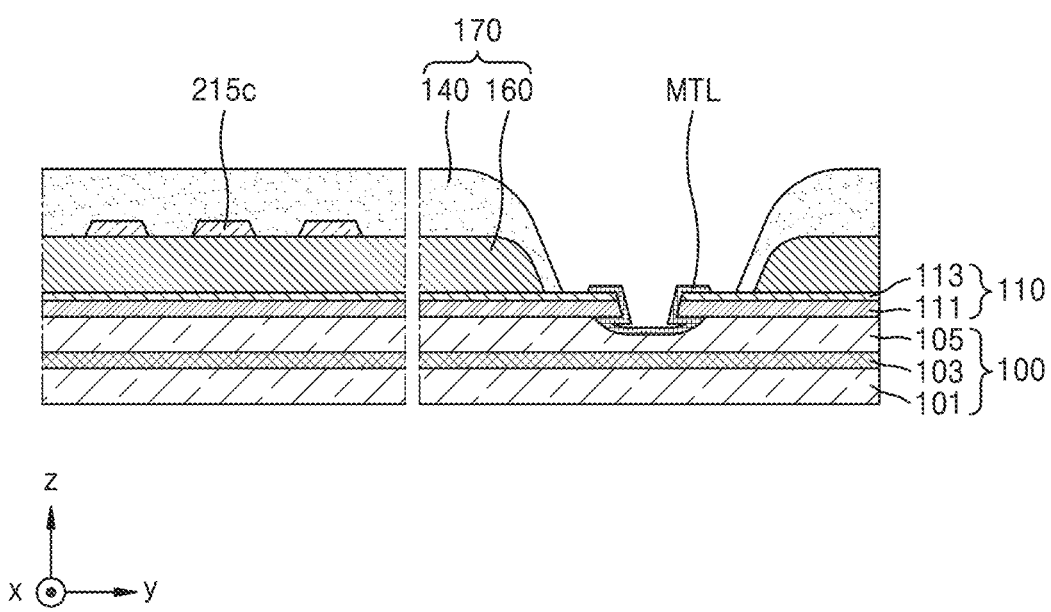
FIG. 16 is a cross-sectional view illustrating a process of a method of manufacturing a display device according to another exemplary embodiment of the present disclosure.
Figure 17:
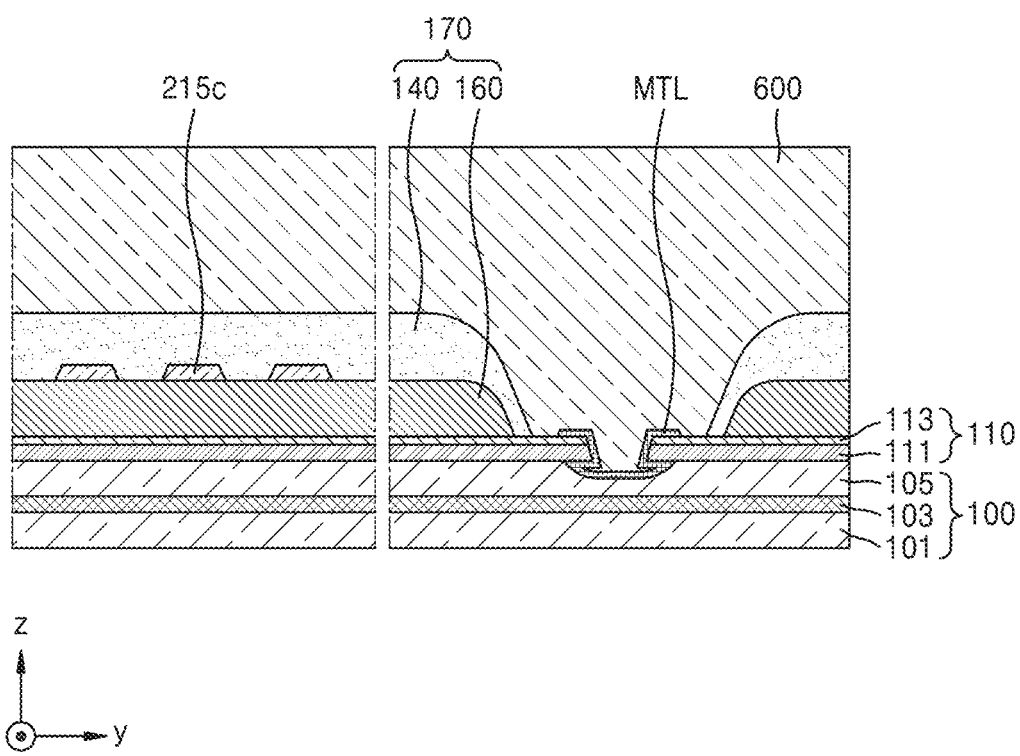
FIG. 17 is a cross-sectional view illustrating a part of a display device according to another exemplary embodiment of the present disclosure.

In another exemplary embodiment, for example, a display device may be manufactured by forming the first groove 100a of the substrate 100 and the first opening 110b of the inorganic insulating layer 110 as shown in FIG. 15, forming a metal layer MTL covering an inner side surface of the first opening 110b and a bottom surface of the first groove 100a as shown in FIG. 16, and forming the BPL 600 as shown in FIG. 17. In this case, a portion of the metal layer MTL on the inner side surface of the first opening 110b and a portion of the metal layer MTL on the bottom surface of the first groove 100a may be connected to each other. Furthermore, the metal layer MTL may cover a part of a top surface of the inorganic insulating layer 110.

The metal layer MTL may protect the inner side surface of the first opening 110b of the inorganic insulating layer 110, and may block the growth of cracks. When the display device includes the second opening 110c and the second groove 100b as shown in FIG. 4 or 5, an inner side surface of the second opening 110c and a bottom surface of the second groove 100b may also be covered by a metal layer. In this case, the metal layer MTL covering the inner side surface of the first opening 110b and the bottom surface of the first groove 100a may not be connected to and may be spaced apart from the metal layer covering the inner side surface of the second opening 110c and the bottom surface of the second groove 100b.

When a metal layer MTL is formed in the display area DA or the first area 1A, the metal layer MTL may be simultaneously formed by using the same material as the metal layer in the display area DA. For example, when the counter electrode 330 (see FIG. 2) is formed, the metal layer MTL may be simultaneously formed by using the same material. Alternatively, a touch sensor layer (not shown) including a touch conductive layer may be formed on the encapsulation layer 410 after the encapsulation layer 410 is formed and before the polarizer 520 is attached or formed. When the touch conductive layer is formed, the metal layer MTL may be simultaneously formed by using the same material as the touch conductive layer. The touch conductive layer (e.g. a first touch conductive layer) refers to any of various electrodes or a bridge wiring for performing a touchscreen function. This applies to the following exemplary embodiments and modifications thereof.

Figure 18:
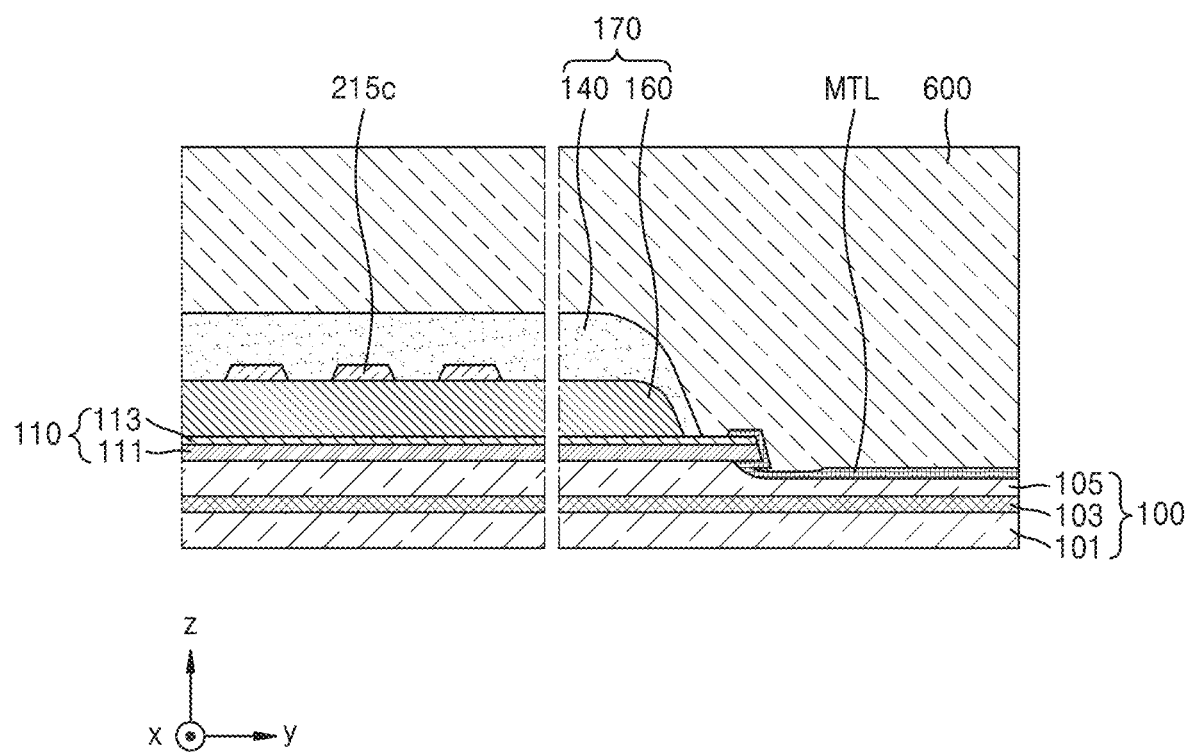
FIG. 18 is a cross-sectional view illustrating a part of a display device according to still another exemplary embodiment of the present disclosure.

As shown in FIG. 18 that is a cross-sectional view illustrating a part of a display device according to still another exemplary embodiment of the present disclosure, in a case that the substrate 100 does not have the first groove 100a but includes the thin portion 100c extending up to an end of the substrate 100 along a direction of the bending axis BAX (e.g., the +y direction), the metal layer MTL may cover a side surface of an end of the inorganic insulating layer 110 close to or in a direction to the thin portion 100c and may cover a top surface of the thin portion 100c. In this case, a portion of the metal layer MTL on the side surface of the inorganic insulating layer 110 and a portion of the metal layer MTL on the top surface of the thin portion 100c may be connected to each other.

Figure 19:
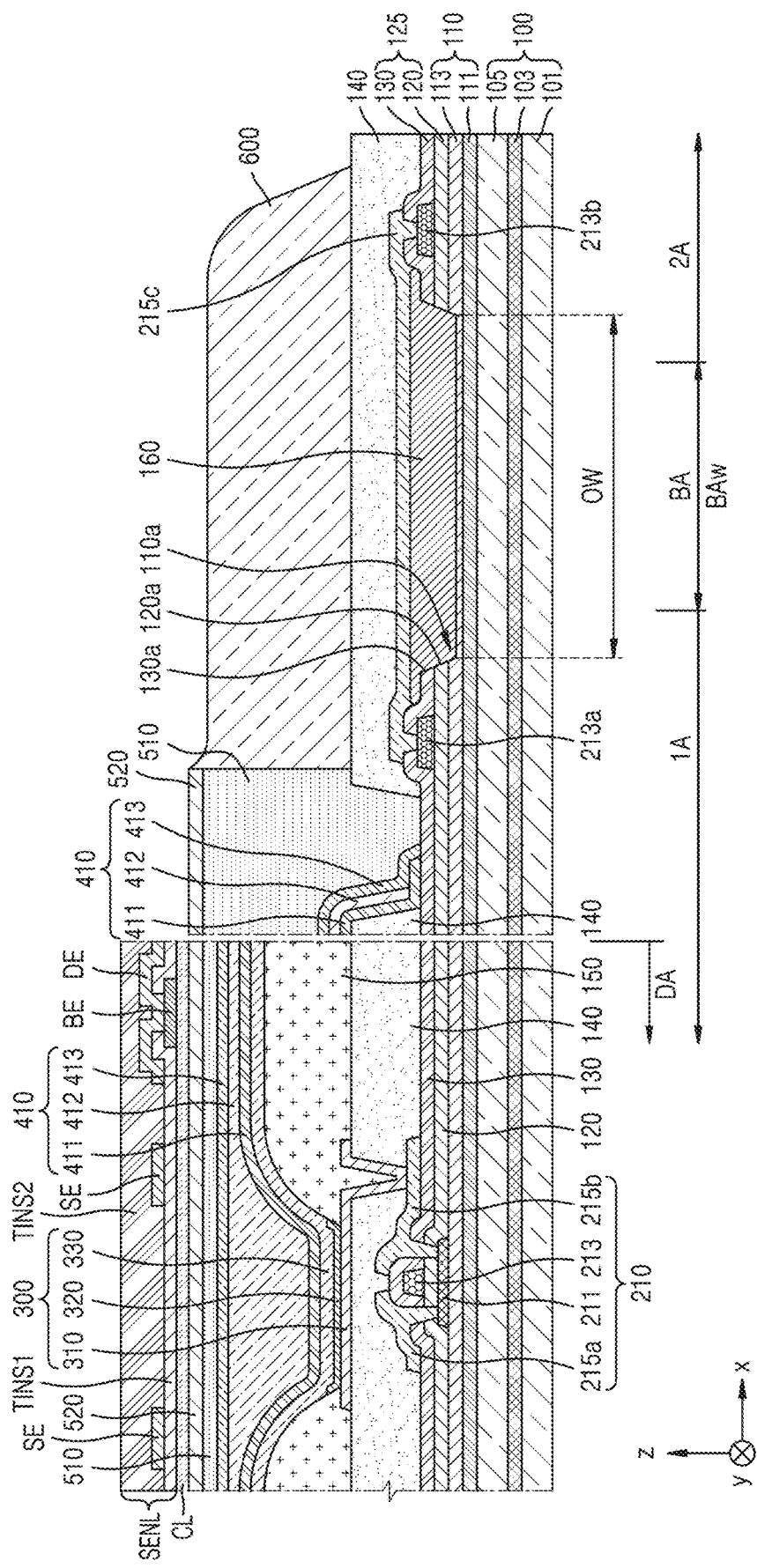
FIG. 19 is a cross-sectional view illustrating a part of a display device according to yet another exemplary embodiment of the present disclosure.

The metal layer MTL of FIGS. 17 and 18 may be formed at the same time by using the same material as the touch conductive layer as described above. As shown in FIG. 19 which is a cross-sectional view illustrating a part of a display device according to yet another exemplary embodiment of the present disclosure, the display device may further include a touch sensor layer SENL located in the first area 1A of the substrate 100. A protective layer CL may be interposed between the touch sensor layer SENL and the polarizer 520 as shown in FIG. 19. However, the present invention is not limited hereto. For example, unlike the structure shown in FIG. 19, the polarizer 520 and OCA 510 may be located over the touch sensor layer SENL and the protective layer CL may contact the encapsulation layer 410. As shown in FIG. 19, the touch sensor layer SENL may include sensing electrodes SE and driving electrode DE. The sensing electrodes SE may be extended in y-axis direction and connected one another, and each of the sensing electrodes SE may have an opening corresponding to a corresponding pixel electrode 310 in order not to hinder light generated in the EML from propagating outside. The driving electrodes DE may be arranged in x-axis direction and separated one another. The driving electrodes DE can be electrically connected one another through bridge electrodes BE located between the protective layer CL and a touch insulating layer TINS1. The bridge electrodes BE may be located to correspond to an area between adjacent pixel electrodes 310. The driving electrode DE may also have an opening corresponding to a corresponding pixel electrode 310 in order not to hinder light generated in the EML from propagating outside. The touch insulating layer TINS1 insulates the bridge electrodes BE from the sensing electrodes SE. The driving electrodes DE can be connected to the bridge electrodes BE through contact holes in the touch insulating layer TINS1. Another touch insulating layer TINS2 may cover the sensing electrodes SE and the driving electrodes DE. The touch conductive layer aforementioned may be the sensing electrodes SE or the driving electrodes DE, or may be the bridge electrode BE. The metal layer MTL may include the same material as that of the touch conductive layer.

As explained above, before the touch sensor layer SENL is formed, the protective layer CL may be formed on the polarizer 520 by using silicon oxide, silicon nitride, or silicon oxynitride, and the touch sensor layer SENL may be formed on the protective layer CL. In this case, the protective layer CL is between the inorganic insulating layer 110 and the touch sensor layer SENL, and contacts a bottom surface of the touch sensor layer SENL. The protective layer CL may also be formed in the bending area BA as well as the first area 1A, and in this case, the metal layer MTL is located on the protective layer CL and contacts the protective layer CL.

Figure 20:
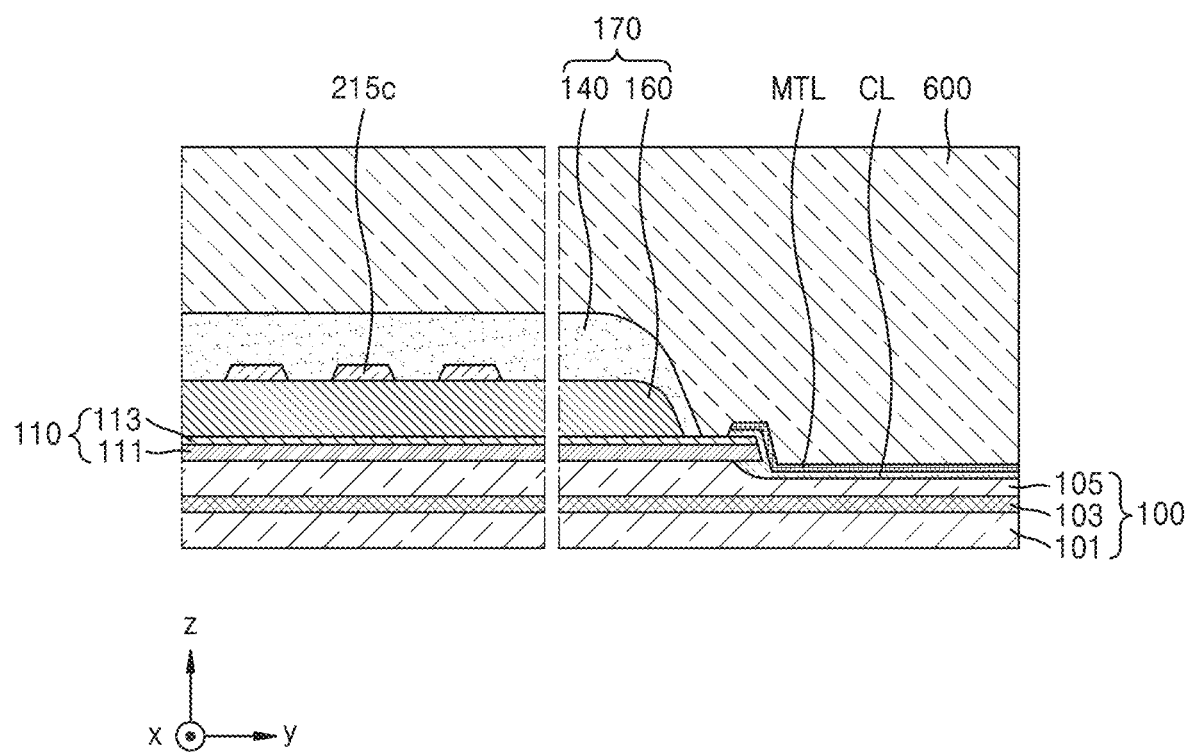
FIG. 20 is a cross-sectional view illustrating a part of a display device according to yet another exemplary embodiment of the present disclosure.

FIG. 20 illustrates that a protective layer CL covers a side surface of an end of the inorganic insulating layer 110 close to or in a direction to the thin portion 100c and covers a top surface of the thin portion 100c, and the metal layer MTL is located on the protective layer CL. Even in the structure of FIG. 17, the protective layer CL may be further located under the metal layer MTL. In this case, when the touch conductive layer of the touch sensor layer SENL is formed, a conductive layer may be formed on the protective layer CL and may be patterned to form the bridge electrodes BE. When the conductive layer is patterned to form the bridge electrodes BE, the protective layer CL and the conductive layer may be simultaneously patterned in the same manner. Accordingly, the protective layer CL in the first area 1A may have the same pattern as the bridge electrodes BE (unlike the structure shown in FIG. 19), and likewise, the protective layer CL may have the same pattern as the metal layer MTL as shown in FIG. 20.

The metal layer MTL may have a multi-layer structure. As explained above, the touch sensor layer SENL may have the sensing electrodes SE, the driving electrodes DE, and the bridge electrode BE located in the first area 1A of the substrate 100. In this case, the metal layer MTL may include a first metal layer including the same material as that of the bridge electrode BE (e.g. a first touch conductive layer) and a second metal layer including the same material as that of the sensing electrode SE and the driving electrode DE (e.g. a second touch conductive layer) and located on the first metal layer. While the sensing insulating layer TINS1 may be between the bridge electrode BE and the sensing electrode SE in the first area 1A, an insulating layer may be not formed in the bending area BA and thus the first metal layer and the second metal layer contact each other.

Even in this case, the protective layer CL may be between the inorganic insulating layer 110 and the touch sensor layer SENL, may contact the touch sensor layer SENL, and may be located in the first area 1A and the bending area BA. The first metal layer may be located on the protective layer CL to contact the protective layer CL (see FIG. 20) in the bending area BA. The protective layer CL in the bending area BA may be spaced apart from the protective layer CL in the first area 1A. This is because when the bridge electrode BE is formed by patterning the conductive layer as described above, the protective layer CL under the bridge electrode BE is also simultaneously patterned in the same pattern.

Figure 21:
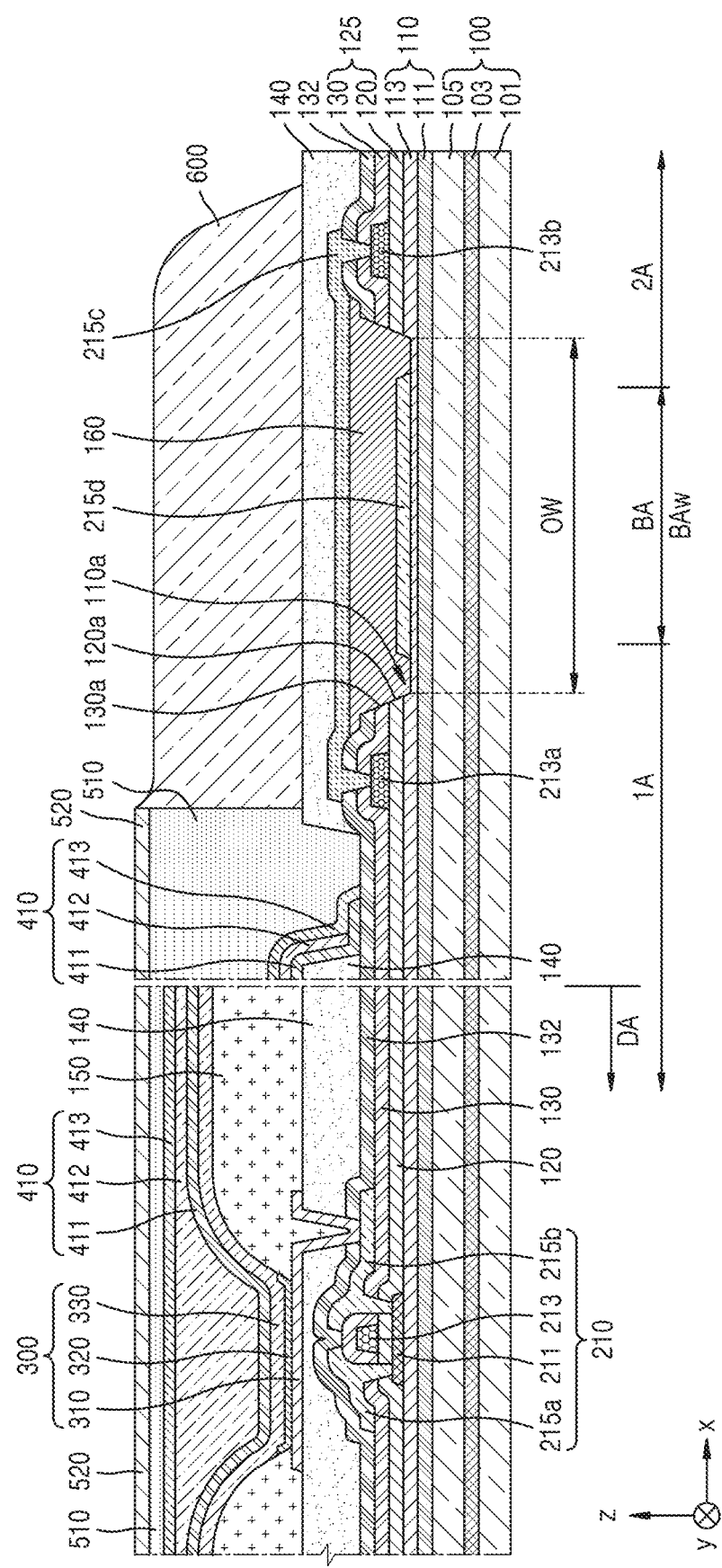
FIG. 21 is a cross-sectional view illustrating a part of a display device according to another exemplary embodiment of the present disclosure.

FIG. 21 is a cross-sectional view illustrating a part of a display device according to another exemplary embodiment of the present disclosure. The display device according to the present exemplary embodiment further includes a protective conductive layer 215d located on the inorganic insulating layer 110 in the bending area BA as shown in FIG. 21. Because a thickness of the inorganic insulating layer 110 is small, the substrate 100 may be bent without a big problem, but cracks may occur in the inorganic insulating layer 110 in the bending area BA due to a stress applied in a bending process or impact applied in a using process after the display device is manufactured. Although such cracks may not be a problem because the organic layer 160 is located on the inorganic insulating layer 110 in the bending area BA, in order to prevent the cracks from affecting the first conductive layer 215c on the organic layer 160, the protective conductive layer 215d may be further located on the inorganic insulating layer 110 in the bending area BA.

In this case, the protective conductive layer 215d may be simultaneously formed by using the same material as the source electrode 215a and the drain electrode 215b when the source electrode 215a and the drain electrode 215b of the TFT 210 in the first area 1A are formed. In this case, a passivation layer 132 may cover the TFT 210, and the first conductive layer 215c may be simultaneously formed by using the same material as a wiring (not shown) located on the passivation layer 132 when the wiring located on the passivation layer 132 is formed.

Figure 22:
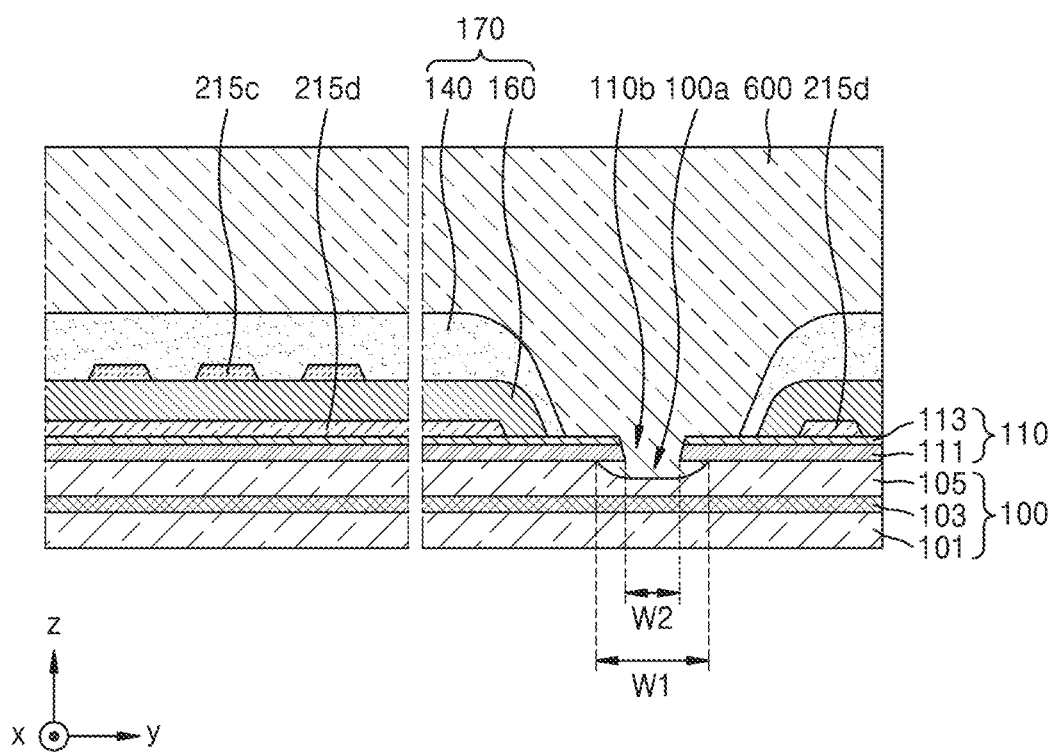
FIG. 22 is a cross-sectional view illustrating a part of a display device according to still another exemplary embodiment of the present disclosure.

When the display device includes the protective conductive layer 215d, as shown in FIG. 22 that is a cross-sectional view illustrating a part of a display device according to still another exemplary embodiment of the present disclosure, the protective conductive layer 215d may also be located on a portion of the inorganic insulating layer 110 located between the first groove 100a of the substrate 100 and an edge of the substrate 100 in the +y direction.

According to an exemplary embodiment of the present disclosure, a display device capable of minimizing defects in a manufacturing process or a using process after the manufacturing process may be provided. However, the scope of the present disclosure is not limited by the effects.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display device comprising: a substrate having a first area, a second area, and a bending area disposed between the first area and the second area, wherein the substrate is bent along a bending axis in the bending area, the substrate comprises a thin portion at an edge portion of the substrate in the bending area, the thin portion extends from the second area to the first area along the edge portion of the substrate, and a thickness of the substrate at the thin portion in the bending area is less than a thickness of the substrate at a center of the first area; and an inorganic insulating layer over the substrate, wherein the inorganic insulating layer exposes the thin portion in the bending area; wherein the thin portion defines a first groove extending from the second area to the first area, and the inorganic insulating layer has a first opening corresponding to the first groove; further comprising a metal layer which covers an inner side surface of the first opening and a bottom surface of the first groove.

2. The display device of claim 1, wherein a width of the first groove is greater than a width of the first opening in a direction of the bending axis.

3. The display device of claim 1, wherein an inner side surface of the first opening protrudes from an edge of the first groove in a direction to a center of the first opening.

4. The display device of claim 1, wherein the substrate has a second groove between an edge of the substrate and the first groove in the bending area, the second groove extends from the second area to the first area, and the inorganic insulating layer has a second opening corresponding to the second groove in the bending area.

5. The display device of claim 4, wherein a width of the second groove is greater than a width of the second opening in a direction of the bending axis.

6. The display device of claim 4, wherein an inner side surface of the second opening protrudes from an edge of the second groove in a direction to a center of the second opening.

7. The display device of claim 4, wherein the second groove extends nonparallel to the first groove.

8. The display device of claim 4, wherein the first groove extends to have a linear shape, and the second groove extends to have a curved shape.

9. The display device of claim 1, wherein a portion of the metal layer on the inner side surface of the first opening and a portion of the metal layer on the bottom surface of the first groove are connected to each other.

10. The display device of claim 1, wherein the metal layer covers a part of a top surface of the inorganic insulating layer.

11. The display device of claim 1, further comprising a touch sensor layer over the first area of the substrate, wherein the touch sensor layer comprises a first touch conductive layer, and the metal layer comprises a same material as a material of the first touch conductive layer.

12. The display device of claim 11, further comprising a protective layer over the first area and the bending area, wherein the protective layer is interposed between the inorganic insulating layer and the touch sensor layer and contacts the touch sensor layer, and the metal layer is on the protective layer to contact the protective layer.

13. The display device of claim 1, wherein the metal layer has a multi-layer structure.

14. The display device of claim 13, further comprising a touch sensor layer over the first area of the substrate, wherein the touch sensor layer comprises a first touch conductive layer and a second touch conductive layer, the metal layer comprises a first metal layer comprising a same material as a material of the first touch conductive layer and a second metal layer comprising a same material as a material of the second touch conductive layer, the second metal layer being on the first metal layer.

15. The display device of claim 14, further comprising a protective layer over the first area and the bending area, wherein the protective layer is interposed between the inorganic insulating layer and the touch sensor layer and contacts the touch sensor layer, and the first metal layer is on the protective layer to contact the protective layer.

16. The display device of claim 1, further comprising an additional insulating layer over the inorganic insulating layer, wherein the additional insulating layer has an additional opening corresponding to the first opening in the bending area.

17. The display device of claim 16, wherein a width of the additional opening is greater than a width of the first opening in a direction of the bending axis.

18. The display device of claim 16, wherein an inner side surface of the first opening protrudes from an edge of the additional opening in a direction to a center of the first opening.

19. The display device of claim 1, wherein the thin portion extends up to an end of the substrate along a direction of the bending axis.

20. The display device of claim 19, wherein an edge of the inorganic insulating layer close to the thin portion corresponds to an edge of the thin portion in a direction to the center of the bending area.

21. The display device of claim 19, wherein a part of an edge of the thin portion in a direction to the center of the bending area has a linear shape extending from the second area to the first area, and a part of an edge of the inorganic insulating layer in a direction to the thin portion has a linear shape extending from the second area to the first area.

22. The display device of claim 19, wherein the end of the substrate in the direction of the bending axis has a curved shape.

23. The display device of claim 19, wherein an end of the inorganic insulating layer close to the thin portion protrudes in a direction to a center of the thin portion, such that a bottom surface of an end portion of the inorganic insulating layer in the direction to the center of the thin portion is spaced apart from the substrate.

24. The display device of claim 19, further comprising a metal layer which covers a side surface of an end of the inorganic insulating layer close to the thin portion and a top surface of the thin portion.

25. The display device of claim 24, wherein a portion of the metal layer on the side surface of the inorganic insulating layer and a portion of the metal layer on the top surface of the thin portion are connected to each other.

26. The display device of claim 24, wherein the metal layer covers a part of a top surface of the inorganic insulating layer.

27. The display device of claim 24, further comprising a touch sensor layer over the first area of the substrate, wherein the touch sensor layer comprises a first touch conductive layer, and the metal layer comprises a same material as a material of the first touch conductive layer.

28. The display device of claim 27, further comprising a protective layer over the first area and the bending area, wherein the protective layer is interposed between the inorganic insulating layer and the touch sensor layer and contacts the touch sensor layer, and the metal layer is on the protective layer to contact the protective layer.

29. The display device of claim 24, wherein the metal layer has a multi-layer structure.

30. The display device of claim 29, further comprising a touch sensor layer over the first area of the substrate, wherein the touch sensor layer comprises a first touch conductive layer and a second touch conductive layer, the metal layer comprises a first metal layer comprising a same material as a material of the first touch conductive layer and a second metal layer comprising a same material as a material of the second touch conductive layer and located on the first metal layer.

31. The display device of claim 30, further comprising a protective layer over the first area and the bending area, wherein the protective layer is interposed between the inorganic insulating layer and the touch sensor layer and contacts the touch sensor layer, and the first metal layer is on the protective layer to contact the protective layer.

32. The display device of claim 19, further comprising an additional insulating layer over the inorganic insulating layer, wherein the additional insulating layer exposes a top surface of an end portion of the inorganic insulating layer close to the thin portion.

33. The display device of claim 1, wherein a thickness of a portion of the inorganic insulating layer corresponding to the bending area is less than a thickness of a portion of the inorganic insulating layer corresponding to a center of the first area.

34. A display device comprising: a substrate having a first area, a second area, and a bending area disposed between the first area and the second area, wherein the substrate is bent along a bending axis in the bending area, the substrate has a first groove at an edge portion of the substrate in the bending area, the first groove is a recessed part of the substrate at the edge portion of the substrate, a thickness of the substrate at the first groove is less than a thickness of the substrate at a center of the first area, and the first groove extends from the second area to the first area along the edge portion of the substrate; and an inorganic insulating layer over the substrate, wherein part of the inorganic insulating layer on the bending area exposes the first groove in the bending area; wherein the inorganic insulating layer has a first opening corresponding to the first groove; further comprising a metal layer which covers an inner side surface of the first opening and a bottom surface of the first groove.

35. The display device of claim 34, wherein a width of the first groove is greater than a width of the first opening in a direction of the bending axis.

36. The display device of claim 34, wherein an inner side surface of the first opening protrudes from an edge of the first groove in a direction to a center of the first opening.

37. The display device of claim 34, wherein the substrate has a second groove between an edge of the substrate and the first groove in the bending area, the second groove extends from the second area to the first area, and the inorganic insulating layer has a second opening corresponding to the second groove in the bending area.

38. The display device of claim 37, wherein a width of the second groove is greater than a width of the second opening in a direction of the bending axis.

39. The display device of claim 37, wherein an inner side surface of the second opening protrudes from an edge of the second groove in a direction to a center of the second opening.

40. The display device of claim 37, wherein the second groove extends nonparallel to the first groove.

41. The display device of claim 37, wherein the first groove extends to have a linear shape, and the second groove extends to have a curved shape.

42. The display device of claim 34, wherein a portion of the metal layer on the inner side surface of the first opening and a portion of the metal layer on the bottom surface of the first groove are connected to each other.

43. The display device of claim 34, wherein the metal layer covers a part of a top surface of the inorganic insulating layer.

44. The display device of claim 34, further comprising a touch sensor layer over the first area of the substrate, wherein the touch sensor layer comprises a first touch conductive layer, and the metal layer comprises a same material as a material of the first touch conductive layer.

45. The display device of claim 44, further comprising a protective layer over the first area and the bending area, wherein the protective layer is interposed between the inorganic insulating layer and the touch sensor layer and contacts the touch sensor layer, and the metal layer is on the protective layer to contact the protective layer.

46. The display device of claim 34, wherein the metal layer has a multi-layer structure.

47. The display device of claim 46, further comprising a touch sensor layer over the first area of the substrate, wherein the touch sensor layer comprises a first touch conductive layer and a second touch conductive layer, the metal layer comprises a first metal layer comprising a same material as a material of the first touch conductive layer and a second metal layer comprising a same material as a material of the second touch conductive layer, and the second metal layer is on the first metal layer.

48. The display device of claim 47, further comprising a protective layer over the first area and the bending area, wherein the protective layer is interposed between the inorganic insulating layer and the touch sensor layer and contacts the touch sensor layer, and the first metal layer is on the protective layer to contact the protective layer.

49. The display device of claim 34, further comprising an additional insulating layer over the inorganic insulating layer, wherein the additional insulating layer has an additional opening corresponding to the first opening in the bending area.

50. The display device of claim 49, wherein a width of the additional opening is greater than a width of the first opening in a direction of the bending axis.

51. The display device of claim 49, wherein an inner side surface of the first opening protrudes from an edge of the additional opening in a direction to a center of the first opening.

52. The display device of claim 34, wherein a thickness of a portion of the inorganic insulating layer corresponding to the bending area is less than a thickness of a portion of the inorganic insulating layer corresponding to a center of the first area.

* * * * *